United States Patent
Usuki et al.

(10) Patent No.: US 6,687,181 B2
(45) Date of Patent: Feb. 3, 2004

(54) SEMICONDUCTOR MEMORY DEVICE WITH LESS DATA TRANSFER DELAY TIME

(75) Inventors: Narikazu Usuki, Tokyo (JP); Kanji Oishi, Tokyo (JP)

(73) Assignees: NEC Corporation (JP); Hitachi, Ltd. (JP); NEC Electronics Corporation (JP)

( * ) Notice: Subject to any disclaimer, the term of this patent is extended or adjusted under 35 U.S.C. 154(b) by 0 days.

(21) Appl. No.: 10/229,615

(22) Filed: Aug. 28, 2002

(65) Prior Publication Data

US 2003/0043682 A1 Mar. 6, 2003

(30) Foreign Application Priority Data

Aug. 31, 2001 (JP) .......................................... 2001-263397

(51) Int. Cl.[7] .................................................. G11C 8/00
(52) U.S. Cl. .................. 365/230.03; 365/233; 711/167; 711/5
(58) Field of Search .............................. 365/230.3, 233, 365/230.01, 189.01; 711/100, 167, 5

(56) References Cited

U.S. PATENT DOCUMENTS 5,903,514 A * 5/1999 Sawada ...................... 365/233
6,147,926 A * 11/2000 Park ........................... 365/233
6,282,150 B1   8/2001 Edo ............................ 365/233

FOREIGN PATENT DOCUMENTS

JP          2000-298983        10/2000   ......... G11C/11/407

* cited by examiner

*Primary Examiner*—Richard Elms
*Assistant Examiner*—Nam Nguyen
(74) *Attorney, Agent, or Firm*—Hayes Soloway, P.C.

(57) ABSTRACT

In a semiconductor memory device, a memory cell array has an even bank activated based on even numbered addresses and an odd bank activated based on odd numbered addresses. Even read data is outputted from the even bank in response to a first control signal, and odd read data is outputted from the odd bank in response to the first read control signal. A relaying unit receives the even read data on the first even data bus to output the even read data to the second even data bus in response to a second read control signal, and receives the odd read data on the first odd data bus to output the odd read data to the second odd data bus in response to the second read control signal. An I/O circuit receives the even read data from the second even data bus and the odd read data from the second odd data bus, and outputs one of the even read data and the odd read data to the common data bus and then outputs the other to the common data bus, in response to a third read control signal.

28 Claims, 13 Drawing Sheets

Fig. 3

| READ START ADDRESS | CAS LATENCY INTEGER (CL="0") | CAS LATENCY SEMI-INTEGER (CL="1") |
|---|---|---|
| EVEN ADDRESS (Y0="0") | Sel_EO/RF="0" <br> OPERATION (A) <br> $\begin{pmatrix} \text{EVEN} \rightarrow \text{RISE} \\ \text{ODD} \rightarrow \text{FALL} \end{pmatrix}$ | Sel_EO/RF="1" <br> OPERATION (B) <br> $\begin{pmatrix} \text{EVEN} \rightarrow \text{FALL} \\ \text{ODD} \rightarrow \text{RISE} \end{pmatrix}$ |
| ODD ADDRESS (Y0="1") | Sel_EO/RF="1" <br> OPERATION (B) <br> $\begin{pmatrix} \text{EVEN} \rightarrow \text{FALL} \\ \text{ODD} \rightarrow \text{RISE} \end{pmatrix}$ | Sel_EO/RF="0" <br> OPERATION (A) <br> $\begin{pmatrix} \text{EVEN} \rightarrow \text{RISE} \\ \text{ODD} \rightarrow \text{FALL} \end{pmatrix}$ |

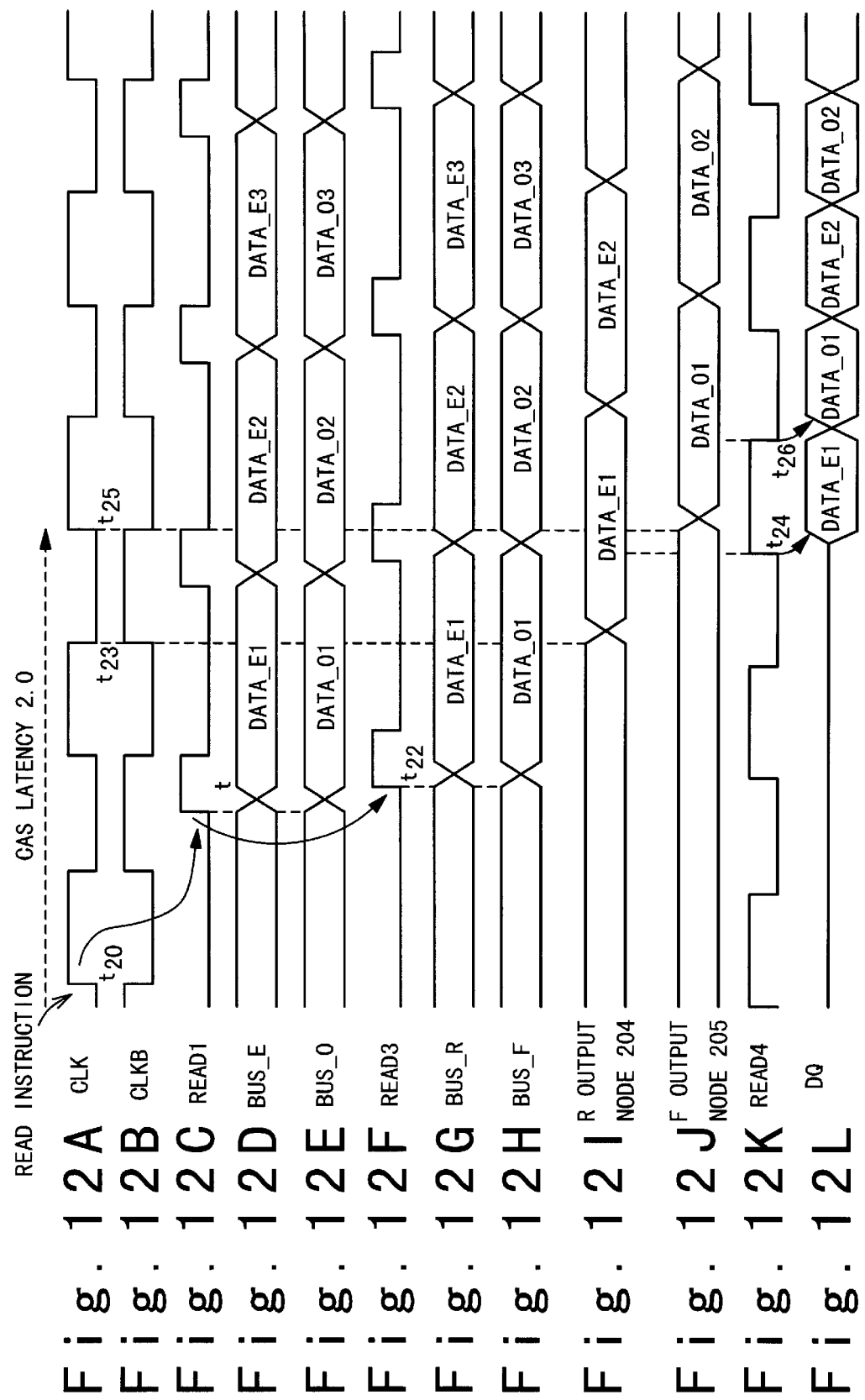

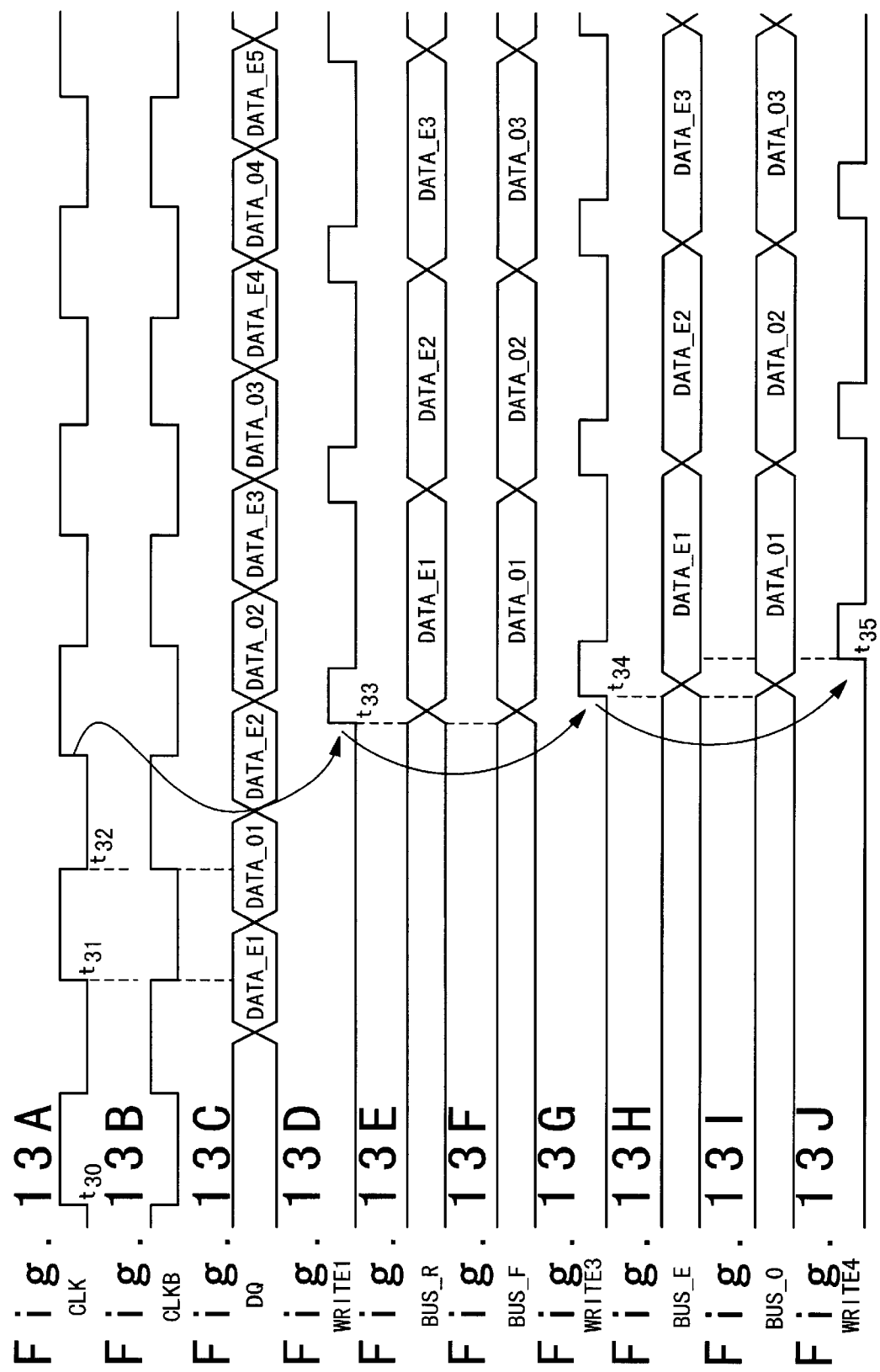

SEMICONDUCTOR MEMORY DEVICE WITH LESS DATA TRANSFER DELAY TIME

BACKGROUND OF THE INVENTION

1. Field of the Invention

The present invention relates to a semiconductor memory. More particularly, the present invention relates to a semiconductor memory in which data transfer from or to the external unit is carried out using the rising edge and falling edge of a clock signal.

2. Description of the Related Art

A semiconductor memory is conventionally known in which fast data transfer from or to the external is carried out using the rising edge and falling edge of a clock signal as triggers. Such a conventional semiconductor memory is disclosed in Japanese Laid Open Patent Application (JP-P2000-298983A).

As shown in FIG. 1, the conventional semiconductor memory is comprised of an input/output pad PA, a demultiplexer DE-MUX, serial-parallel converting circuits S-Pe and S-Po, write amplifiers WAe and WAo, memory cell arrays SAe and SAo, data amplifiers DAe and DAo, parallel-serial converting circuits P-Se and P-So, and a multiplexer MUX.

The demultiplexer DE-MUX divides inputted serial data containing 1-bit data into even data in the rising up of a basic clock signal CLK and odd data in the falling down of the basic clock signal CLK. The even data and the odd data are transferred to the memory cell arrays SAe and SAo by the buses 501 and 502 and are written therein, respectively. The memory cell array SAe is arranged nearer the input/output pad PA than the memory cell array SAo.

In case of a read operation, the even data and the odd data stored in the memory cell arrays SAe and SAo are transferred to the multiplexer MUX through the buses 503 and 504, respectively. The multiplexer MUX outputs the even data and the odd data to the input/output pad PA in response to the rising edge and falling edge of the basic clock signal, respectively.

The even data contains bit data read first when the read operation is carried out. In the conventional semiconductor memory, the memory cell array SAe for storing the even data is arranged nearer the input/output pad PA than the memory cell array SAo. Thus, the length of the bus 503 for transferring the bit data read first when the read operation is carried out can be made short, resulting in realization of a high-speed operation.

However, in recent years, the high integration of the semiconductor memory elongates the distance between the memory cell array and the input/output pad. In accompaniment to this, the length of the bus for transferring data between the memory cell array and the input/output pad increases. The increase of the length of the bus causes the increase of a delay time in the data transfer. The conventional semiconductor memory is effective to shortening the time from the issuance of a read instruction to the output of data. However, the conventional semiconductor memory cannot solve the problem of the increase of the delay time due to the increase of the length of buses fundamentally.

SUMMARY OF THE INVENTION

Therefore, an object of the present invention is to provide a semiconductor memory device in which a delay time due to increase of the length of a bus can be made small in data transfer between a memory cell and an input/output pad.

Another object of the present invention is to provide a semiconductor memory device in which the number of buffers relating to the data transfer can be reduced.

In an aspect of the present invention, a semiconductor memory device includes a memory cell array which has an even bank activated based on even numbered addresses and an odd bank activated based on odd numbered addresses, a first even data bus connected with the even bank, a second even data bus, a first odd data bus connected with the odd bank, a second odd data bus, a common data bus. Even read data is outputted from the even bank in response to a first control signal, and odd read data is outputted from the odd bank in response to the first read control signal. A relaying unit is provided between a set of the first even and odd data buses and a set of the second even and odd data buses to receive the even read data on the first even data bus to output the even read data to the second even data bus in response to a second read control signal, and to receive the odd read data on the first odd data bus to output the odd read data to the second odd data bus in response to the second read control signal. An I/O circuit is provided between the common data bus and the set of the second even and odd data buses to receive the even read data from the second even data bus and the odd read data from the second odd data bus, and to output one of the even read data and the odd read data to the common data bus and then outputs the other to the common data bus, in response to a third read control signal.

Here, the semiconductor memory device may further include an external connection pad connected with the common data bus.

The I/O circuit may select one of the even read data and the odd read data based on a read selection control signal and output the selected data to the common data bus and then the other to the common data bus in response to the third read control signal.

In this case, the I/O circuit may output the selected data to the common data bus in response to a rising edge of the third read control signal and then the other to the common data bus in response to a falling edge of the third read control signal.

Also, the I/O circuit may receive write data from the common data bus in response to a first write control signal, the write data containing first write data and second write data subsequent to the first write data, and output one of the first and second write data as even write data to the second even data bus and the other as odd write data to the second odd data bus. The relaying unit may receive the even write data on the second even data bus to output to the first even data bus in response to a second write control signal, and receive the odd write data on the second odd data bus to output to the first odd data bus in response to the second write control signal. The even write data may be written in the even bank in response to a third write control signal, and the odd write data may be written in the odd bank in response to the third write control signal.

In this case, the I/O circuit may receive the first write data in response to a rising edge of the first write control signal, and the second write data in response to a falling edge of the first write control signal.

Also, the I/O circuit may select one of the first and second write data as the even write data based on a write selection control signal, and output the even write data to the second even data bus and the other as the odd write data to the second odd data bus.

Also, the semiconductor memory device may further include a control circuit which generates the first to third read control signals in response to an external clock signal. Also, the semiconductor memory device may further include the control circuit which generates the first to third write control signals in response to an external clock signal.

Also, the semiconductor memory device may further include a selection control circuit which generates the read selection control signal in response to a read start address and a CAS latency. Also, the semiconductor memory device may further include a selection control circuit which generates the write selection control signal in response to a write start address.

Also, the I/O circuit may include a selector section which selects one of the even read data and the odd read data based on the read selection control signal, and an output circuit which outputs the selected data to the common data bus and then the other to the common data bus in response to the third read control signal.

Also, the relaying unit may include a first tri-state buffer provided between the first even data bus and the second even data bus to receive the even read data on the first even data bus to output the even read data to the second even data bus in response to the second read control signal, and a second tri-state buffer provided between the first odd data bus and the second odd data bus to receive the odd read data on the first odd data bus to output the odd read data to the second odd data bus in response to the second read control signal.

Also, the relaying unit may include a first tri-state buffer provided between the first even data bus and the second even data bus to buffers the even write data on the second even data bus to output the even write data to the first even data bus in response to the second write control signal, and a second tri-state buffer provided between the first odd data bus and the second odd data bus to buffers the odd write data on the second odd data bus to output the odd write data to the first odd data bus in response to the second write control signal.

In another aspect of the present invention, a semiconductor memory device includes a memory cell array which has an even bank activated based on even numbered addresses and an odd bank activated based on odd numbered addresses, a first even data bus connected with the even bank, a second even data bus, a first odd data bus connected with the odd bank, a second odd data bus, a common data bus. First read data is outputted from the even bank in response to a first control signal, and second read data is outputted from the odd bank in response to the first read control signal. A relaying unit is provided between a set of the first even and odd data buses and a set of the second even and odd data buses to receive the first read data from the even data bus and the second read data from the second odd data bus, and to output one of the first read data and the second read data as third read data to the second even data bus and outputs the other as fourth read data to the second odd data bus, in response to a second read control signal. An I/O circuit is provided between the common data bus and the set of the second even and odd data buses to receive the third read data and the fourth read data from the set of the second even and odd data buses and to output the third read data and the fourth read data to the common data bus in response to a third read control signal.

The semiconductor memory device may further include an external connection pad connected with the common data bus.

The relaying unit may select one of the even read data and the odd read data as the third read data based on a read selection control signal and output the third read data to the second even data bus and the fourth read data to the second odd data bus in response to the second read control signal.

Also, the I/O circuit may output the third read data to the second even data bus in response to a rising edge of the third read control signal and then the fourth read data to the second odd data bus in response to a falling edge of the third read control signal.

Also, the I/O circuit may receive write data from the common data bus, the write data containing first write data and second write data subsequent to the first write data, and output the first and second write data to the second even data bus and the second odd data bus in response to a first write control signal. The relaying unit may select one of the first write data and the second write data to output the selected one of the first write data and the second write data as third write data to the first even data bus, and output the other as fourth write data to the first even and odd data buses in response to the second write control signal. The third write data on the first even data bus may be written in the even bank in response to a third write control signal, and the fourth write data on the first odd data bus may be written in the odd bank in response to the third write control signal.

Also, the I/O circuit may output the first write data onto the second even data bus in response to a rising edge of the first write control signal, and the second write data onto the second odd data bus in response to a falling edge of the first write control signal.

Also, the relaying unit may select one of the first and second write data as the third write data based on a write selection control signal.

Also, the semiconductor memory device may further include a control circuit which generates the first to third read control signals in response to an external clock signal.

Also, the semiconductor memory device may further include a control circuit which generates the first to third write control signals in response to an external clock signal.

Also, the semiconductor memory device may further include a selection control circuit which generates the read selection control signal in response to a read start address and a CAS latency.

Also, the semiconductor memory device may further include a selection control circuit which generates the write selection control signal in response to a write start address.

Also, the I/O circuit may include an output circuit which outputs the third read data on the second even data bus and the fourth read data on the second odd data bus to the common data bus in response to the third read control signal.

Also, the relaying unit may include a selector section connected with the first even and odd data buses to select one of the first read data and the second read data as the third read data based on the read selection control signal, the other is the fourth read data, a first tri-state buffer connected the second even data bus to buffer and output the third read data onto the second even data bus in response to the third read control signal, and a second tri-state buffer connected with the second odd data bus to buffer and output the fourth read data onto the second odd data bus in response to the second read control signal.

Also, the relaying unit may include a selector section connected with the second even and odd data buses to select one of the first write data and the odd read data based on the read selection control signal, the other being the fourth write data, a first tri-state buffer connected with the first even data bus to buffer and output the third read data onto the first even data bus in response to the third read control signal, and a second tri-state buffer connected with the first odd data bus to buffer and output the fourth write data onto the first odd data bus in response to the second read control signal.

BRIEF DESCRIPTION OF THE DRAWINGS

FIG. 3 shows relation between the operation of an I/O circuit, CAS latency and a read start address;

FIGS. 12A to 12L are timing charts showing a read operation of the semiconductor memory in the second embodiment; and FIGS. 13A to 13J are timing charts showing a write operation of the semiconductor memory in the second embodiment.

DESCRIPTION OF THE PREFERRED EMBODIMENTS

Hereinafter, a semiconductor memory of the present invention will be described with reference to the attached drawings.

Figure 1:
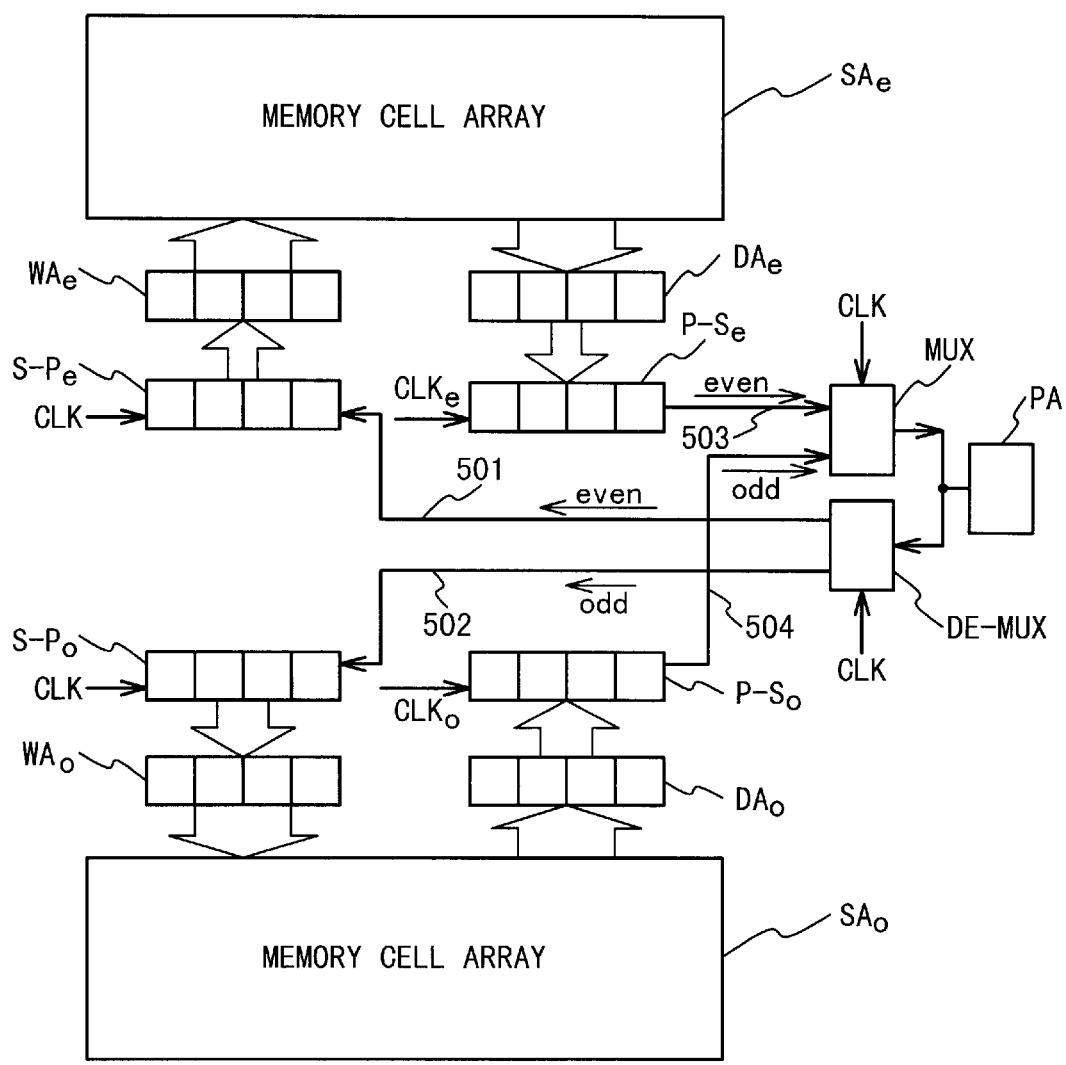
FIG. 1 shows a conventional semiconductor memory.
Figure 2:
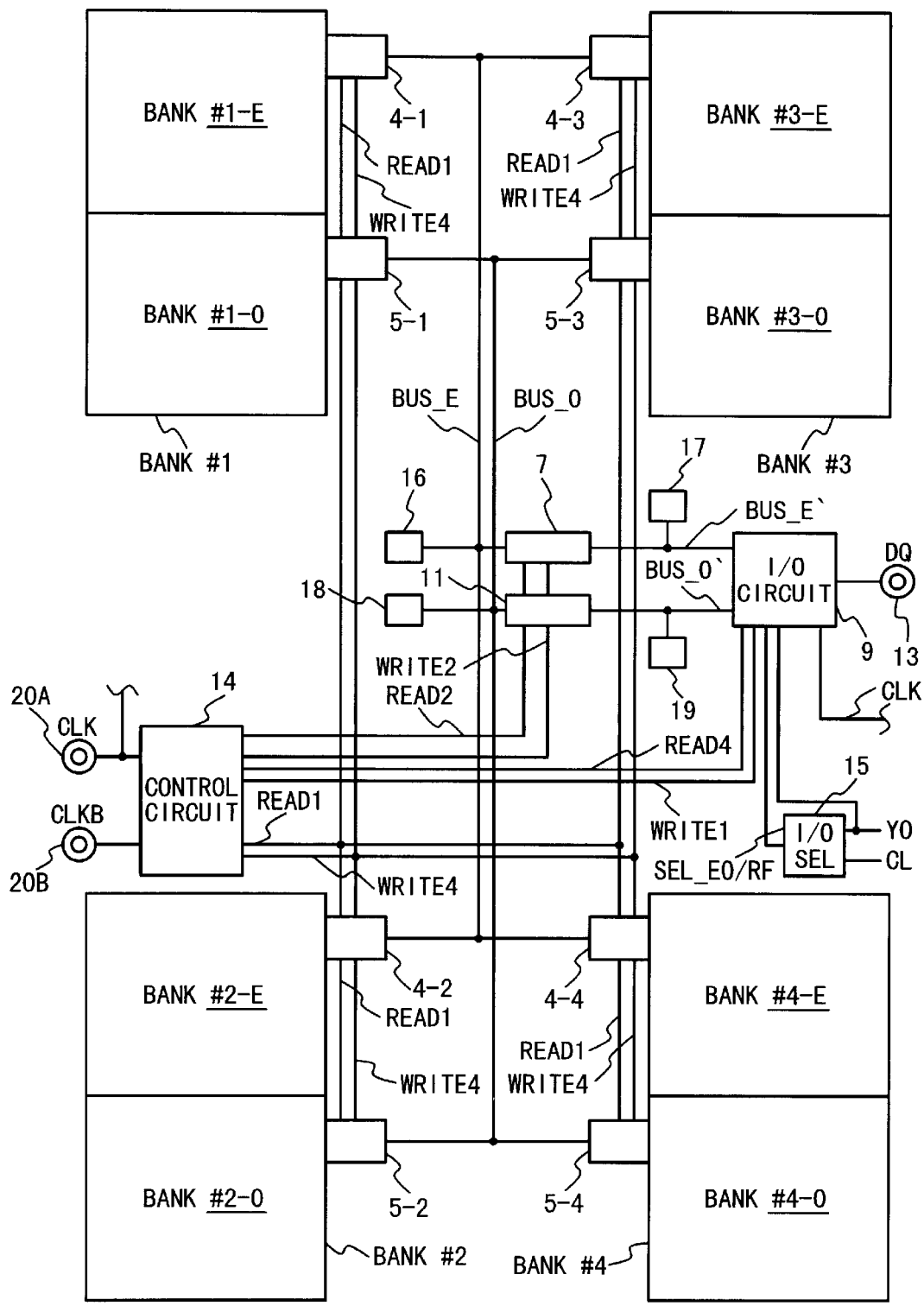
FIG. 2 shows a semiconductor memory according to a first embodiment according to the present invention.

FIG. 2 shows the semiconductor memory according to the first embodiment of the present invention. The semiconductor memory in the first embodiment is a double data rate—synchronous type dynamic random access memory (DDR-SDRAM). In the first embodiment, bidirectional buffers are provided on the way of buses for transferring write data and read data between an I/O circuit from memory cells. In this way, the time constant of the bus can be made small, and the speeding-up of the data transfer is achieved.

As shown in FIG. 2, banks #1 to #4 are provided for the semiconductor memory. The bank #1 is comprised of a bank #1_E as an area for even numbered addresses and a bank #1_O as an area for odd numbered addresses. In this case, the even numbered addresses are addresses Y allocated to the semiconductor memory device to have the least significant bit Y0 of "0", and the odd numbered addresses are addresses Y to have the least significant bit Y0 of "1". In the same way, the banks #2 to #4 contain the banks #2-E, #3-E and #4-E as areas for the even numbered addresses and the banks #2-O, #3-O and #4-O as areas for the odd numbered addresses.

Hereinafter, stored data of an even numbered address is referred to as "even data", and stored data of an odd numbered address is referred to as "odd data". Also, the even data is read out from any of the banks #1 to #4 in case of a read operation and is referred to as even read data, and the odd data is read out from any of the banks #1 to #4 in case of the read operation and is referred to as odd read data. Also, the even data is written in any of the banks #1 to #4 in case of a write operation and is referred to as even write data, and the odd data is written in any of the banks #1 to #4 in case of the write operation is referred to as odd write data.

Main amplifiers 4-1 to 4-4 are provided for the banks #1-E to #4-E, respectively. The main amplifiers 4-1 to 4-4 are collectively called a main amplifier 4. The main amplifier 4 reads the even read data from the banks #1-E to #4-E. The read even read data is transferred to the I/O circuit 9 through a first even data bus BUS_E, a bidirectional buffer circuit 7 as a part of a relaying unit and a second even data bus BUS_E' and is outputted from the I/O circuit 9. Also, even write data is received from a pad 13 by the I/O circuit 9, is transferred to the main amplifier 4 through the second even data bus BUS_E', the bidirectional buffer circuit 7 and the first even data bus BUS_E and is written in any of the banks #1-E to #4-E by the main amplifier 4.

In the same way, main amplifiers 5-1 to 5-4 are provided for the banks #1-O to #4-O to read out odd read data, respectively. The main amplifiers 5-1 to 5-4 are collectively called a main amplifier 5. The odd read data is transferred to the I/O circuit 9 through the first odd data bus BUS_O, the bidirectional buffer circuit 11 as a part of the relaying unit and the second odd data bus BUS_O' and is outputted from the I/O circuit 9. Also, odd write data received by the I/O circuit 9 from the pad 13 is transferred to the main amplifier 5 through the second odd data bus BUS_O', the bidirectional buffer circuit 11 and the first odd data bus BUS_O and is written in any of the banks #1-O to #4-O by the main amplifier 5.

Moreover, a control circuit 14 and a data output operation instructing circuit 15 are provided for the semiconductor memory device. The data output operation instructing circuit 15 generates an operation instruction signal SEL_EO/RF to control the data output operation of the I/O circuit 9. The control circuit 14 controls the operation of the main amplifiers 4 and 5, the bidirectional buffer circuits 7 and 11 and the I/O circuit 9. An external clock signal CLK is supplied to the control circuit 14 from a clock signal pad 20A and an inverted external clock signal CLKB from the clock signal pad 20B is supplied to the control circuit 14. The inverted external clock signal CLKB is an inverted signal of the external clock signal CLK. Using the external clock signal CLK and the inverted external clock signal CLKB as the reference of the timings, the control circuit 14 generates the following group of signals:

(1) Control signals Read1 and Write4 used for the control of the read and write operations by the main amplifier 4 and 5, (2) Control signals Read2 and Write2 used for the control of the read and write operations by the bidirectional buffer circuit 7 and 11, and (3) Control signals Read4 and Write1 used for the control of the read and rite operations by the I/O circuit 9.

The timings of data transfer in the semiconductor memory device are properly controlled based on these signals.

The even read data is read from any of the banks #1-E to #4-E and transferred from the main amplifier 4 to the I/O circuit 9 while the transfer timings are controlled based on the control signals Read1, Read2 and Read3.

In response to the control signal Read1 from the control circuit 14, the main amplifier 4 reads out the even read data from any of the banks #1-E to #4-E and outputs to the first even data bus BUS_E. The first even data bus BUS_E transfers the even read data from the main amplifiers 4-1 to 4-4 to the bidirectional buffer 7.

Figure 4:
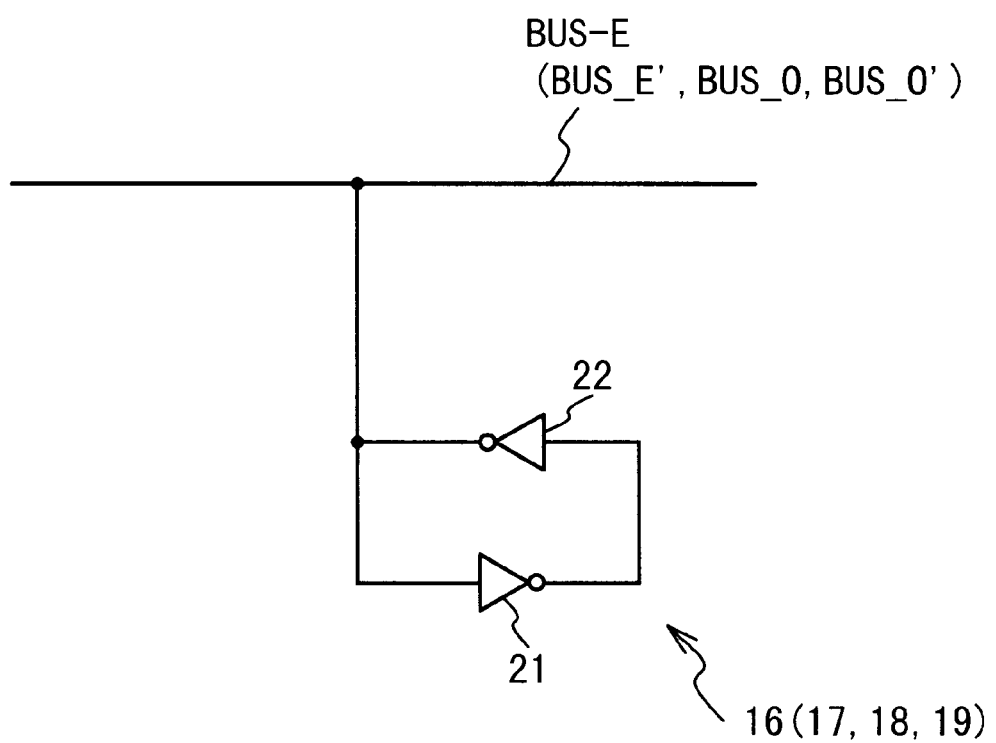
FIG. 4 shows the circuit structure of a latch circuit.

A latch circuit 16 is connected with the first even data bus BUS_E. The latch circuit 16 holds the first even data bus BUS_E to the high voltage or the low voltage in accordance with the data transferred on the first even data bus BUS_E. FIG. 4 shows the circuit structure of the latch circuit 16. The latch circuit 16 contains an inverter 21 and an inverter 22. The output terminal of the inverter 21 is connected with the input terminal of the inverter 22 and the output terminal of the inverter 22 is connected with the input terminal of the inverter 21. The output terminal of the inverter 22 and the input terminal of the inverter 21 are connected with the first even data bus BUS_E.

The bidirectional buffer circuit 7 receives and buffers the even read data transferred on the first even data bus BUS_E. Also, when the bidirectional buffer circuit 7 is activated based on the control signal Read2, the bidirectional buffer circuit 7 outputs the received even read data to the second even data bus BUS_E'.

The latch circuit 17 is connected with the second even data bus BUS_E', like the first even data bus BUS_E. The circuit structure and operation of the latch circuit 17 are same as the latch circuit 16. The latch circuit 17 latches the second even data bus BUS_E' to the high voltage or the low voltage in accordance with the data transferred on the second even data bus BUS_E'.

The second even data bus BUS_E' transfers the even read data from the bidirectional buffer circuit 7 to the I/O circuit 9. The I/O circuit 9 outputs the even read data from the pad 13 to an external unit.

Also, the even write data to be written in any of the banks #1-E to #4-E is transferred from the I/O circuit 9 to the main amplifier 4 while the transfer timings are controlled based on the control signals Write1, Write2 and Write4. When the I/O circuit 9 is activated based on the control signal Write1, the I/O circuit 9 outputs the even write data from the pad 13 to the second even data bus BUS_E'. The second even data bus BUS_E' transfers the even write data to the bidirectional buffer 7.

The bidirectional buffer 7 receives the even write data transferred on the second even data bus BUS_E' and buffers it. Also, when the bidirectional buffer circuit 7 is activated based on the control signal Write2, the bidirectional buffer circuit 7 outputs the even write data to the first even data bus BUS_E. The first even data bus BUS_E transfers the even write data from the bidirectional buffer 7 to the main amplifier 4. The main amplifier 4 writes the even write data in any of the banks #1-E to #4-E in response to the control signal Write4.

In the semiconductor memory device in the first embodiment, the bidirectional buffer circuit 7 is provided for the route connecting between the main amplifier 4 and the I/O circuit 9. Thus, the delay time in case of the data transfer between the main amplifier 4 and the I/O circuit 9 is shorted. The time required for the signal to propagate through the bus is proportional to a square of the length of the bus. In the first embodiment, the bus connecting between the main amplifier 4 and the I/O circuit 9 is divided into the first even data bus BUS_E and the second even data bus BUS_E' by the bidirectional buffer circuit 7. For example, if the bidirectional buffer circuit 7 is provided on the halfway point of the bus connecting between the main amplifier 4 and the I/O circuit 9 to divide the bus into the first even data bus BUS_E and the second even data bus BUS_E' equally in length, the time constant of the first even data bus BUS_E and that of the second even data bus BUS_E' become a quarter. As a result, the delay time between the main amplifier 4 and the I/O circuit 9 becomes about ½. In this way, the delay time in case of the data transfer between the main amplifier 4 and the I/O circuit 9 is shortened.

Although the even numbered address side is described above, the odd numbered address side is similar in the circuit structure. The main amplifiers 5-1 to 5-4 are provided for the banks #1_O to #4_O, respectively, and are connected with the I/O circuit 9 through the second odd data bus BUS_O', which is connected with the first odd data bus BUS_O which is connected with a latch circuit 18, a bidirectional buffer circuit 11, and a latch circuit 19. The transfer of the odd data is carried out between the banks #1_ to #4_O and the I/O circuit 9.

Like the route connecting between the main amplifier 4 and the I/O circuit 9, the bus connecting between the main amplifier 5 and the I/O circuit 9 is divided into the first odd data bus BUS_O and the second odd data bus BUS_O' by the bidirectional buffer circuit 11. Thus, the delay time in case of the transfer of the odd data is shortened.

The I/O circuit 9 inputs and outputs data through the data input/output pad 13. In more detail, the I/O circuit 9 receives even read data from the second even data bus BUS_E' and odd read data from the second odd data bus BUS_O', and outputs them to the data input/output pad 13, when the semiconductor memory device carries out the read operation. Also, when the semiconductor memory device carries out the write operation, the I/O circuit 9 receives write data from the data input/output pad 13, extracts the even write data and odd write data from the received write data, and outputs onto the second even data bus BUS_E' and the second odd data bus BUS_O'.

The control signal Read4 sent to the I/O circuit 9 determines the timing when the data stored in the banks #1 to #4 are outputted outside the semiconductor memory device in case of the read operation. Especially, the control signal Read4 is sometimes called a flying clock signal Read4. The read data is outputted to the data input/output pad 13, using both of the rising edge and the falling edge of the flying clock signal Read4 as triggers. The flying clock signal Read4 has the waveform which is substantially the same as the external clock signal CLK. However, the flying clock signal Read4 is the signal, which has a phase proceeding to the external clock, signal CLK by a little bit. By a time equivalent to the delay time of the I/O circuit 9, the phase of the flying clock signal Read4 is preceded. Thus, the delay time of the I/O circuit 9 is compensated.

When the I/O circuit 9 outputs read data, the I/O circuit 9 can carry out the following two operations based on the standard of DDR-SDRAM:

(A) Even read data is outputted to the data input/output pad 13 upon rising up of the flying clock signal Read4, and odd read data is outputted to the data input/output pad 13 upon falling down of the flying clock signal Read4, and (B) Even read data is outputted to the data input/output pad 13 upon falling down of the flying clock signal Read4, and odd read data is outputted to the data input/output pad 13 upon falling down of the flying clock signal Read4.

Which of the operations (A) and (B) is carried out by the I/O circuit 9 is determined by the data output operation instructing circuit 15 based on the lowest start address signal Y0 and a CAS latency instruction signal CL. The data output operation instructing circuit 15 sends an operation instruction signal SEL_EO/RF to the I/O circuit 9 to instruct which of the operations (A) and (B) is carried out by the I/O circuit 9.

The CAS latency instruction signal CL is a signal showing whether or not the CAS latency is an integer or is a "half integer". Here, the "half integer" means a value obtained by adding 0.5 to an integer, and 1.5 or 2.5 is the "half integer". The CAS latency instruction signal CL is "0" when the CAS latency is an integer, and is "1" when it is the "half integer". The CAS latency is instructed from outside the semiconductor memory device, and is represented using the period T of an external clock signal given to the semiconductor memory device as a unit. For example, when the CAS latency is 2.0, read data is outputted twice of the period T of the external clock signal CLK after a read request is issued. Similarly, when the CAS latency is 2.5, read data is outputted 2.5 times of the period T of the external clock signal after the read request is issued.

On the other hand, the lowest start address signal Y0 shows the lowest address of the read start address. If the lowest start address signal Y0 is "0" (=low voltage), the read start address is an even numbered address. If the lowest start address signal Y0 is "1" (=high voltage), the read start address is an odd numbered address.

FIG. 3 shows the content of the operation instruction signal SEL__EO/RF. When the read start address is an even numbered address (Y0="0") and the CAS latency is an integer (CL="0"), the operation instruction signal SEL__EO/RF is "0". In accordance with the operation instruction signal SEL__EO/RF of "0", the I/O circuit 9 outputs even read data to the data input/output pad 13 when the flying clock signal Read4 rises up. When the flying clock signal Read4 falls down, the I/O circuit 9 outputs odd data to the data input/output pad 13. That is, the I/O circuit 9 carries out the operation (A).

On the other hand, when the read start address is an even numbered address (Y0="0") and the CAS latency is a half integer (CL="1"), the operation instruction signal SEL__EO/RF is "1". In accordance with the operation instruction signal SEL__EO/RF of "1", the I/O circuit 9 outputs even data to the data input/output pad 13 in response to the falling edge of the flying clock signal Read4. When the flying clock signal Read4 rises up, the I/O circuit 9 outputs odd data to the data input/output pad 13. That is, the I/O circuit 9 carries out the operation (B).

In the same way, when the read start address is an odd numbered address (Y0="1") and the CAS latency is an integer (CL="0"), the operation instruction signal SEL__EO/RF is "1". The I/O circuit 9 carries out the operation (B).

Moreover, when the read start address is an odd numbered address (Y0="1") and the CAS latency is a half integer (CL="0"), the operation instruction signal SEL__EO/RF is "0" and the I/O circuit 9 carries out the operation (A).

It is possible to form the data output operation instructing circuit 15 by an XOR gate to whose input terminal the lowest start address signal Y0 and the CAS latency instruction signal CL are inputted. In this case, the above-mentioned operation instruction signal SEL__EO/RF is outputted from the output terminal to the XOR gate.

Next, the bidirectional buffer circuit 7 provided between the first even data bus BUS__E and the second even data bus BUS__E', and the bidirectional buffer circuit 11 provided between the first odd data bus BUS__O and the second odd data bus BUS__O' will be described below in detail.

Figure 5:
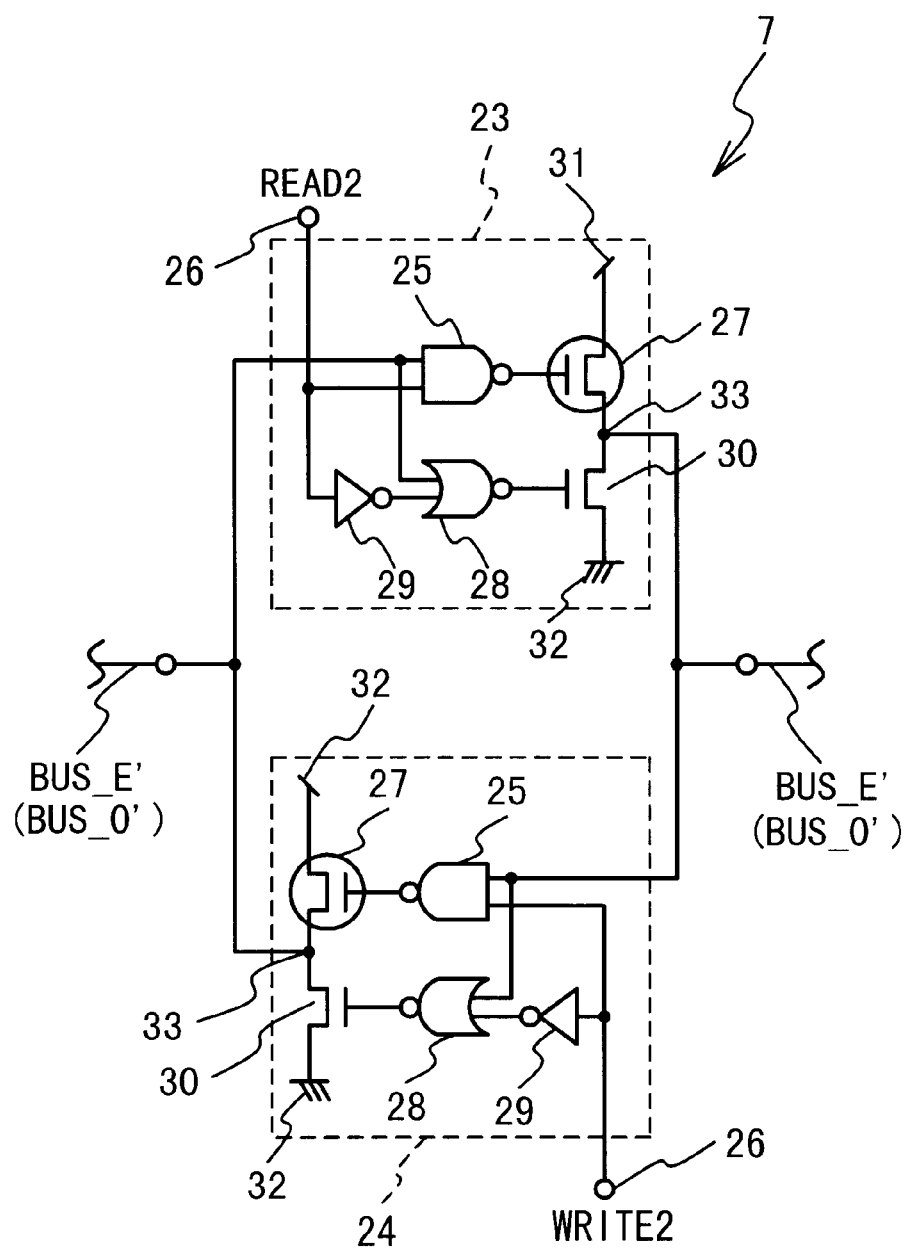
FIG. 5 shows the circuit structure of a bidirectional buffer circuit.

FIG. 5 shows the circuit structures of the bidirectional buffer circuit 7 and the bidirectional buffer circuit 11. The bidirectional buffer circuit 7 and the bidirectional buffer circuit 11 differ in the connected buses but they have the same circuit structure. Therefore, the circuit structure of the bidirectional buffer circuit 7 will be described.

The bidirectional buffer circuit 7 contains a tri-state buffer 23 and a tri-state buffer 24. The tri-state buffer 23 is used in case of a read operation and the tri-state buffer 24 is used in case of a write operation. In case of the read operation, the tri-state buffer 23 receives and buffers even read data from the first even data bus BUS__E. When being activated based on the control signal Read2, the tri-state buffer 23 outputs the received even read data to the second even data bus BUS__E'.

The tri-state buffer 23 contains a NAND gate 25, a PMOS transistor 27, a NOR gate 28, an inverter 29, an NMOS transistor 30, a power terminal 31, a ground terminal 32 and an output terminal 33. The first input terminal of the NAND gate 25 is connected with the first even data bus BUS__E. The second input terminal of the NAND gate 25 is connected with the terminal 26 to which the control signal Read2 is inputted. The output terminal of the NAND gate 25 is connected with the gate of the PMOS transistor 27. On the other hand, the first input terminal of the NOR gate 28 is connected with the first even data bus BUS__E. The second input terminal of the NOR gate 28 is connected with the terminal 26 to which the control signal Read2 is inputted through the inverter 29. The output terminal of the NOR gate 28 is connected with the gate of the NMOS transistor 30. The PMOS transistor 27 and the NMOS transistor 30 are connected between the power terminal 31 and the ground terminal 32 in series. In detail, the source of the PMOS transistor 27 is connected with the power terminal 31 of a power potential VCC and the drain of the PMOS transistor 27 and the drain of the NMOS transistor 30 are connected with the output terminal 33. The source of the NMOS transistor 30 is connected with ground terminal 32. The output terminal 33 is connected with the second even data bus BUS__E'.

The operation in which the tri-state buffer 23 buffers the even data and outputs to the even data bus BUS__E' by is carried out as follows. It is supposed that the control signal Read2 is low voltage, and the first even data bus BUS__E is set to the high voltage or the low voltage in accordance with the transferred even data. When the control signal Read2 becomes the high voltage from the low voltage, the tri-state buffer 23 takes therein the even data from the first even data bus BUS__E and outputs to the second even data bus BUS__E'. The drive abilities of the PMOS transistor 27 and the NMOS transistor 30 at this time are predetermined to be sufficiently greater than that of the latch circuit 17 connected with the second even data bus BUS__E' set. The tri-state buffer 23 can set the voltage of the second even data bus BUS__E' compulsorily regardless of the output of the latch circuit 17. Subsequently, when the control signal Read2 becomes the low voltage from the high voltage, the PMOS transistor 27 and the NMOS transistor 30 disconnect the second even data bus BUS__E' from the power terminal 31 and the ground terminal 32. In this case, the voltage of the second even data bus BUS__E' immediately before the control signal Read2 becomes the low voltage from the high voltage is held by the latch circuit 17. Through the above process, the buffering operation of the tri-state buffer 23 completes.

In case of the write operation, the tri-state buffer 24 receives and buffers the even write data from the second even data bus BUS__E'. Moreover, the tri-state buffer 24 outputs the received even write data to the first even data bus BUS__E in response to the activation of the control signal Write2. The tri-state buffer 23 and the tri-state buffer 24 are used in both of the read operation and write operation, respectively. With the tri-state buffer 23 and the tri-state buffer 24, although the transfer directions of the data are opposite to each other, the operations are similar. Therefore, the detailed description is omitted.

Figure 6:
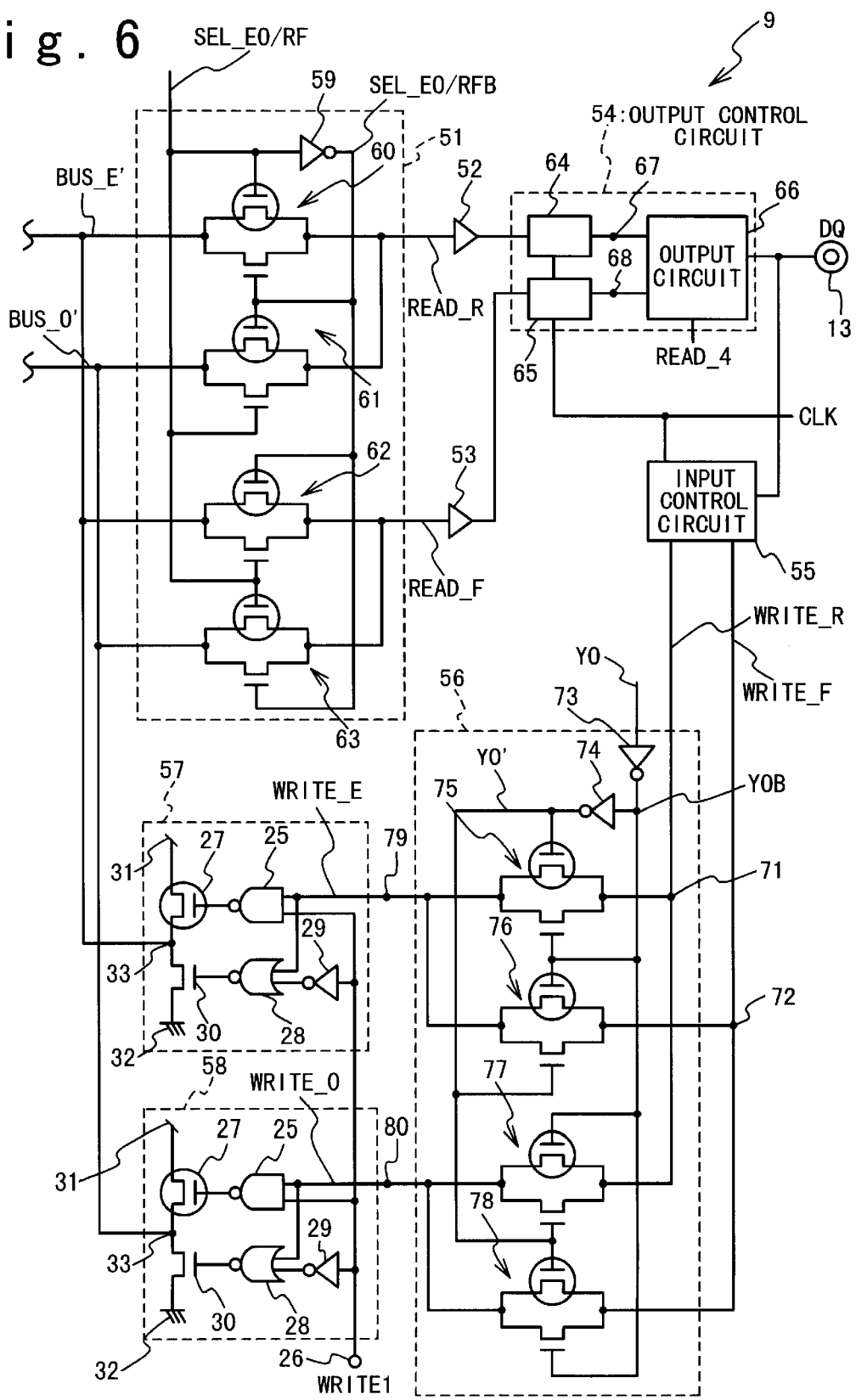
FIG. 6 shows the circuit structure of an I/O circuit.

FIG. 6 shows the circuit structure of the I/O circuit 9. The I/O circuit 9 is comprised of selectors 51 and 56, buffers 52 and 53, an output control circuit 54, an input control circuit 55, and tri-state buffers 57 and 58.

The selector 51, the buffer 52, the buffer 53, and the output control circuit 54 output the even data transferred on the second even data bus BUS_E' and the odd data transferred on the second odd data bus signal BUS_O' from the data input/output pad 13.

The selector 51 contains an inverter 59 and transfer gates 60 to 63. The inverter 59 inverts the operation instruction signal SEL_EO/RF to generate an inverted operation instruction signal SEL_EO/RFB. The transfer gate 60 is interposed between the buffer 52 and the second even data bus BUS_E', and the transfer gate 61 is interposed between the buffer 52 and the second odd data bus BUS_O'. The transfer gate 60 and the transfer gate 61 become conductive states exclusively in response to the operation instruction signal SEL_EO/RF and the inverted operation instruction signal SEL_EO/RFB. On the other hand, the transfer gate 62 is interposed between the buffer 53 and the second even data bus BUS_E', and the transfer gate 63 is interposed between the buffer 53 and the second odd data bus BUS_O'. The transfer gate 62 and the transfer gate 63 become a conductive state exclusively in response to the operation instruction signal SEL_EO/RF and the inverted operation instruction signal SEL_EO/RFB.

The selector 51 having such a circuit structure outputs as rise read data Read_R, one of the even data transferred on the second even data bus BUS_E' and the odd data transferred on the second odd data bus BUS_O' in accordance with the operation instruction signal SEL_EO/RF. On the other hand, the selector 51 outputs the other as fall read data Read_F. The rise read data Read_R is outputted from the data input/output pad 13 when the flying clock signal Read4 rises up and the fall read data Read_F is outputted from the data input/output pad 13 when the flying clock signal Read4 falls down.

The correspondence relations of the even data and the odd data, and rise read data Read_R and the fall read data Read_F are set based on the operation instruction signal SEL_EO/RF. The selector 51 outputs the even data as the Rise output data and outputs the odd data shown by the odd data signal BUS_O' as the Fall output data, when the operation instruction signal SEL_EO/RF is "0" (=low voltage). On the other hand, when the operation instruction signal SEL_EO/RF is "1" (=high voltage), the selector 51 outputs the even data as the fall output data, and outputs the odd data as the Rise output data.

The buffer 52 buffers and outputs the rise read data Read_R from the selector 51. A voltage drop of the signal for the rise read data Read_R is caused due to the resistance of the transfer gate of the selector 51. The buffer 52 is provided to compensate the voltage drop in the transfer gate of the selector 51. Similarly, the buffer 53 is provided to compensate the potential drop in the transfer gate of the selector 51. The buffer 53 buffers and outputs the fall read data Read_F.

The output control circuit 54 outputs the rise read data Read_R to the data input/output pad 13 when the flying clock signal Read4 rises up, and outputs the fall read data Read_F to the data input/output pad 13 when the flying clock signal Read4 falls down. The output control circuit 54 is comprised of latches 64 and 65 and an output circuit 66. The external clock signal CLK is inputted to the latch 64. The latch 64 takes therein the rise read data Read_R and outputs to the R output node 67 when the external clock signal CLK falls down. After that, when the flying clock signal Read4 rises up, the rise read data Read_R is outputted to the data input/output pad 13 through the R output node 67. That is, the latch 64 plays a role to prepare the rise read data Read_R that should be outputted from the data input/output pad 13 before the flying clock signal Read4 rises up.

In the same way, when the external clock signal CLK rises up, the latch 65 takes therein the fall read data Read_F and outputs to an F output node 68. The fall read data Read_F is outputted to the data input/output pad 13 through the F output node 68 when the flying clock signal Read4 falls down. That is, the latch 65 plays a role to prepare the fall read data Read_F which should be outputted from the data input/output pad 13 before the flying clock signal Read4 falls down and falls down. The output circuit 66 outputs the rise read data Read_R to the data input/output pad 13 through the R output node 67 in response to the rising edge of the flying clock signal Read4 and outputs the fall read data Read_F to the data input/output pad 13 through the F output node 68 in response to the falling edge of the flying clock signal Read4.

On the other hand, the input control circuit 55 takes therein write data from the data input/output pad 13 in synchronism with the external clock signal CLK. At this time, the input control circuit 55 takes therein the write data using both of the rising edge and falling edge of the external clock signal CLK as triggers. Thereafter, the data received in response to the rising edge of the external clock signal CLK is called the rise write data Write_R. The data received in response to the falling edge of the external clock signal CLK is called the fall write data Write_F.

The input control circuit 55 outputs the rise write data Write_R to the R input node 71 and outputs the fall write data Write_F to the F input node 72.

One of the rise write data Write_R and the fall write data Write_F is written in any of the bank #1-E to #4-E as the even write data and the other is written in any of the bank #1-O to #4-O as the odd write data. When the write operation is carried out, a write start address is given to the semiconductor memory device. When the write start address is an even numbered address, the rise write data Write_R is the even write data and the fall write data Write_F is odd write data. On the other hand, when the write start address is an odd numbered address, the rise write data Write_R is the odd write data and the fall write data Write_F is the even write data.

The rise write data Write_R and the fall write data Write_F are inputted to the selector 56. The selector 56 is comprised of the inverters 73, 74 and the transfer gates 75, 76, 77, and 78. The selector 56 outputs one of the rise write data Write_R and the fall write data Write_F to an E input node 79 as even write data Write_E based on the lowest start address signal Y0. On the other hand, the selector 56 outputs the other to an R input node 80 as the odd write data Write_O based on the odd numbered address.

In more detail, when the start address signal Y0 is "0" (=low voltage), i.e., the write start address is an even numbered address, the selector 56 outputs the rise write data Write_R to the E input node 79 as the even write data Write_E and outputs the fall write data Write_F to the O input node 80 as odd write data Write_O. On the other hand, when the start address signal Y0 is "1" (=low voltage), i.e., the write start address is an odd numbered address, the selector 56 outputs the rise write data Write_R to the E input node 79 as odd write data Write_O and outputs the fall write data Write_F to the O input node 80 as odd write data Write_O.

The even write data Write_E is inputted to the tri-state buffer 57 and the odd write data Write_O is inputted to the tri-state buffer 58. The tri-state buffer 57 buffers the even write data Write_E in case of the write operation. The circuit structure of the tri-state buffer 57 is the same as the tri-state buffer 24, and the same reference numerals are allocated to the same elements of the tri-state buffer 57 as those of the tri-state buffer 24. The tri-state buffer 57 receives the even write data Write_E from the E input node 79 and buffers it. Moreover, when the tri-state buffer 57 is activated based on the control signal Write1, the tri-state buffer 57 outputs the received even write data Write_E to the second even data bus BUS_E'. The even write data Write_E outputted to the second even data bus BUS_E' is transferred to the main amplifier 4 through the bidirectional buffer 7, the first even data bus BUS_E and is written in any of the banks #1-E to #4-E.

The tri-state buffer 58 buffers the odd write data Write_O in case of the write operation. The circuit structure of the tri-state buffer 58 is the same as the tri-state buffer 24 and the same reference numerals are allocated to the same elements of the tri-state buffer 58 as those of the tri-state buffer 24. The tri-state buffer 58 receives the odd write data Write_O from the R input node 80 and buffers it. Moreover, when the tri-state buffer 58 is activated based on the control signal Write1, the tri-state buffer 58 outputs the received odd write data Write_O to the second odd data bus BUS_O'. Te odd write data Write_O outputted to the second odd data bus BUS_O' is transferred to the main amplifier 5 through the bidirectional buffer 11 and the first odd data bus BUS_O ands is written in any of the banks #1-O to #4-O.

Next, the read operation of the semiconductor memory device will be described. Before the read operation is carried out, the CAS latency is indicated to the semiconductor memory device. Below, the CAS latency is supposed to have been set to 2.0.

Figure 7:
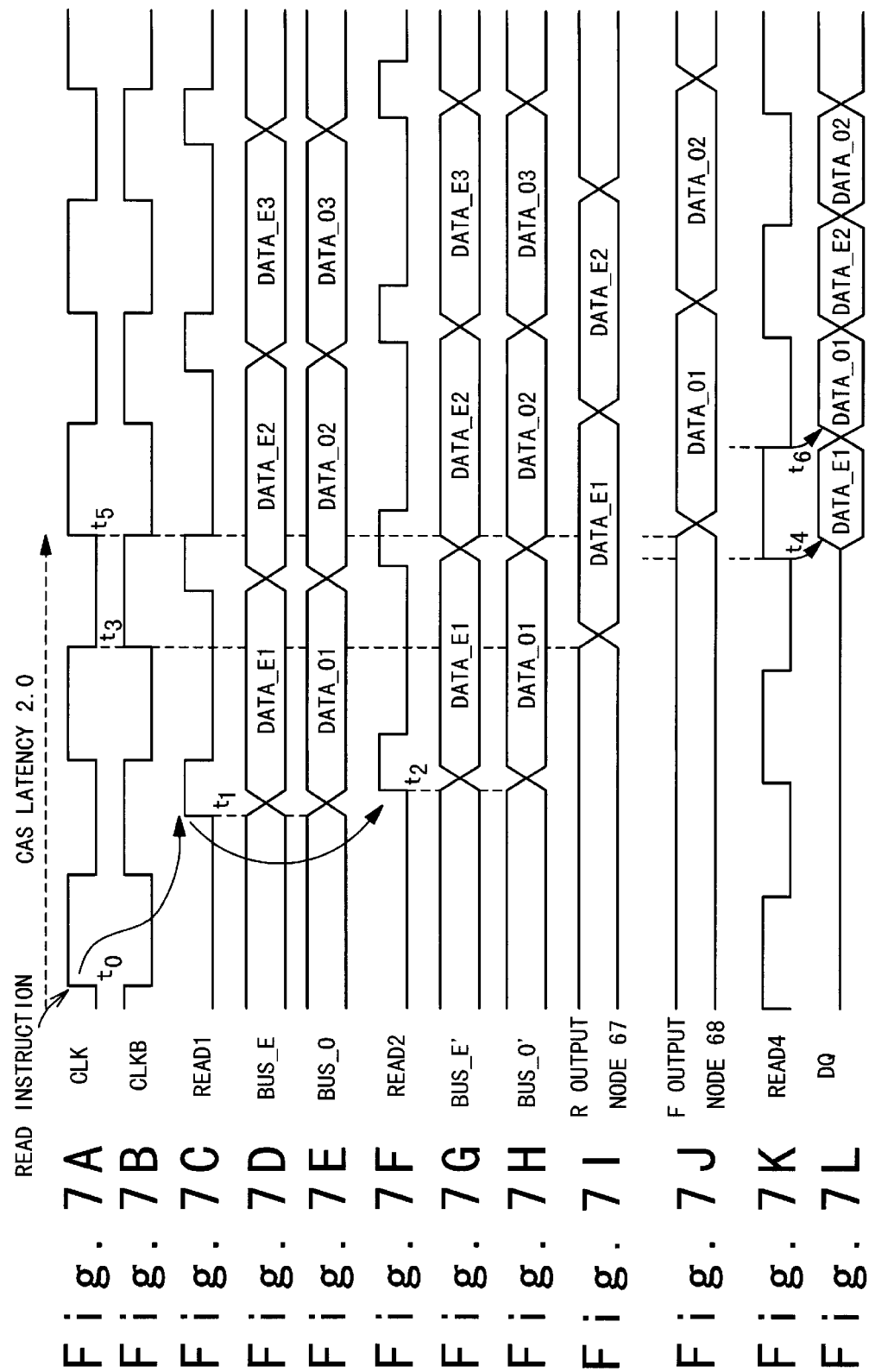
FIGS. 7A to 7L are timing charts showing a read operation of the semiconductor memory in the first embodiment.

A read instruction is supposed to be issued to the semi-conductor memory device at a time t0 in synchronism with the rising edge of the external clock signal CLK as shown in FIG. 7A. A read start address is specified by the read instruction. Here, the read start address is an even numbered addresses, i.e., the lowest start address signal Y0 is supposed to be set to "0". In this case, as shown in FIG. 3, the operation instruction signal SEL_E0/RF is set to "0". The I/O circuit 9 outputs even data to the data input/output pad 13 when the flying clock signal Read4 rises up, and outputs odd data to the data input/output pad 13 when the flying clock signal Read4 falls down. That is, the I/O circuit 9 carries out the above-mentioned operation (A).

When the read instruction is issued, one of the main amplifiers 4 and one of the main amplifiers 5 are selected in accordance to the read address. Here, the main amplifiers 4-1 and 5-1 are supposed to have been selected. The main amplifier 4-1 reads the even data Data_E1 from the bank #1-E. The main amplifier 5-1 reads the odd data Data_O1 from the bank #1-O.

Subsequently, as shown in FIG. 7C, the control circuit 14 raises the control signal Read1 from the low voltage to the high voltage at the time t1 a predetermined time after the read instruction is issued. The main amplifier 4-1 outputs the even data Data_E1 to the first even data bus BUS_E when the control signal Read1 rises up, as shown in FIG. 7D. In the same way, the main amplifier 5-1 outputs odd data Data_O1 to the first odd data bus BUS_O when the control signal Read1 rises up, as shown in FIG. 7E.

The bidirectional buffer circuit 7 receives the even data Data_E1 from the first even data bus BUS_E. In the same way, the bidirectional buffer circuit 11 receives the odd data Data_O1 from the first odd data bus BUS_O.

Subsequently, the control circuit 14 starts the control signal Read2 from the low voltage to the high voltage at the time t2 after a predetermined time from the time t1, as shown in FIG. 7F. When the control signal Read2 rises up, the bidirectional buffer circuit 7 outputs the even data Data_E1 to the second even data bus BUS_E', as shown in FIG. 7G. In the same way, the bidirectional buffer circuit 11 outputs the odd data Data_O1 to the second odd data bus BUS_O' when the control signal Read2 rises up, as shown in FIG. 7H. At this time, in response to the operation instruction signal SEL_E0/RF of "0", the selector 51 shown in FIG. 6 outputs the even data Data_E1 as the rise read data Read_R. Moreover, the selector 51 outputs the odd data Data_O1 as the fall read data Read_F.

After that, as shown in FIG. 7I, the latch 64 of the I/O circuit 9 outputs the even data Data_E1 to the R output node 67 when the external clock signal CLK falls down at a time t3 (t3>t2). After that, when the flying clock signal Read4 rises up at the time t4, and the output circuit 66 takes therein the even data Data_E1 from the R output node 67 and outputs to the data input/output pad 13, as shown in FIGS. 7K and 7L. As described above, the flying clock signal Read4 is a signal which is proceeding to the external clock signal CLK a little bit in phase. The phase of the flying clock signal Read4 is preceded by the time equivalent to the delay time in the I/O circuit 9. Thus, the delay time in the I/O circuit 9 is compensated.

Subsequently, as shown in FIG. 7J, when the external clock signal CLK rises up at time t5, the latch 65 of the I/O circuit 9 takes therein and outputs the odd data Data_O1 to the F output node 68. After that, when the flying clock signal Read4 falls down at the time t6, the output circuit 66 takes therein the odd data Data_O1 from the F output node 68 and outputs the odd data Data_O1 to the data input/output pad 13, as shown in FIGS. 7K and 7L.

Like the output of even data Data_E1, the delay time in the I/O circuit 9 is compensated by proceeding the phase of the flying clock signal Read4 minutely on the output of odd data Data_O1.

In this way, when the CAS latency is 2.0 and the read start address is an even numbered address, the even data Data_E1 is outputted to the data input/output pad 13 using the rising edge of the flying clock signal Read4 as a trigger, and the odd data Data_O1 is outputted to the data input/output pad 13 using the falling edge of the flying clock signal Read4 as a trigger.

When the following read instruction continues, the even data data_E2 is read out from the bank #2-E subsequent to the even data Data_E1, in the same way. Moreover, the read-out even data data_E2 is outputted to the data input/output pad 13 using the rising edge of the flying clock signal Read4 as a trigger. Also, the odd data data_O2 is read out from the bank #2-O subsequent to the odd data Data_O1, and the read-out odd data data_O2 is outputted to the data input/output pad 13 using the falling edge of the flying clock signal Read4 as a trigger.

When the CAS latency is different from the above-mentioned 2.0 and the read start address is an odd numbered address, a read operation is carried out like the above. In this case, which of the rising edge and falling edge of the flying clock signal Read4 is used for to output each of the even data and the odd data to the data input/output pad 13 is set as shown in FIG. 3, like the above.

Subsequently, the write operation of the semiconductor memory device will be described. As shown in FIGS. 8A to 8J, it is supposed that a writing instruction is issued to the semiconductor memory device at a time t10 in synchronism with the rising edge of the external clock signal CLK. The write start address is specified by the writing instruction. In this case, it is supposed that the write start address is an even numbered address, i.e., the lowest start address signal Y0 is set to "0". In this case, the even write data is inputted to the data input/output pad 13 in synchronism with the rising edge of the external clock signal CLK from the external, and the odd write data is inputted in synchronism with the falling edge of the external clock signal CLK.

Figure 8:
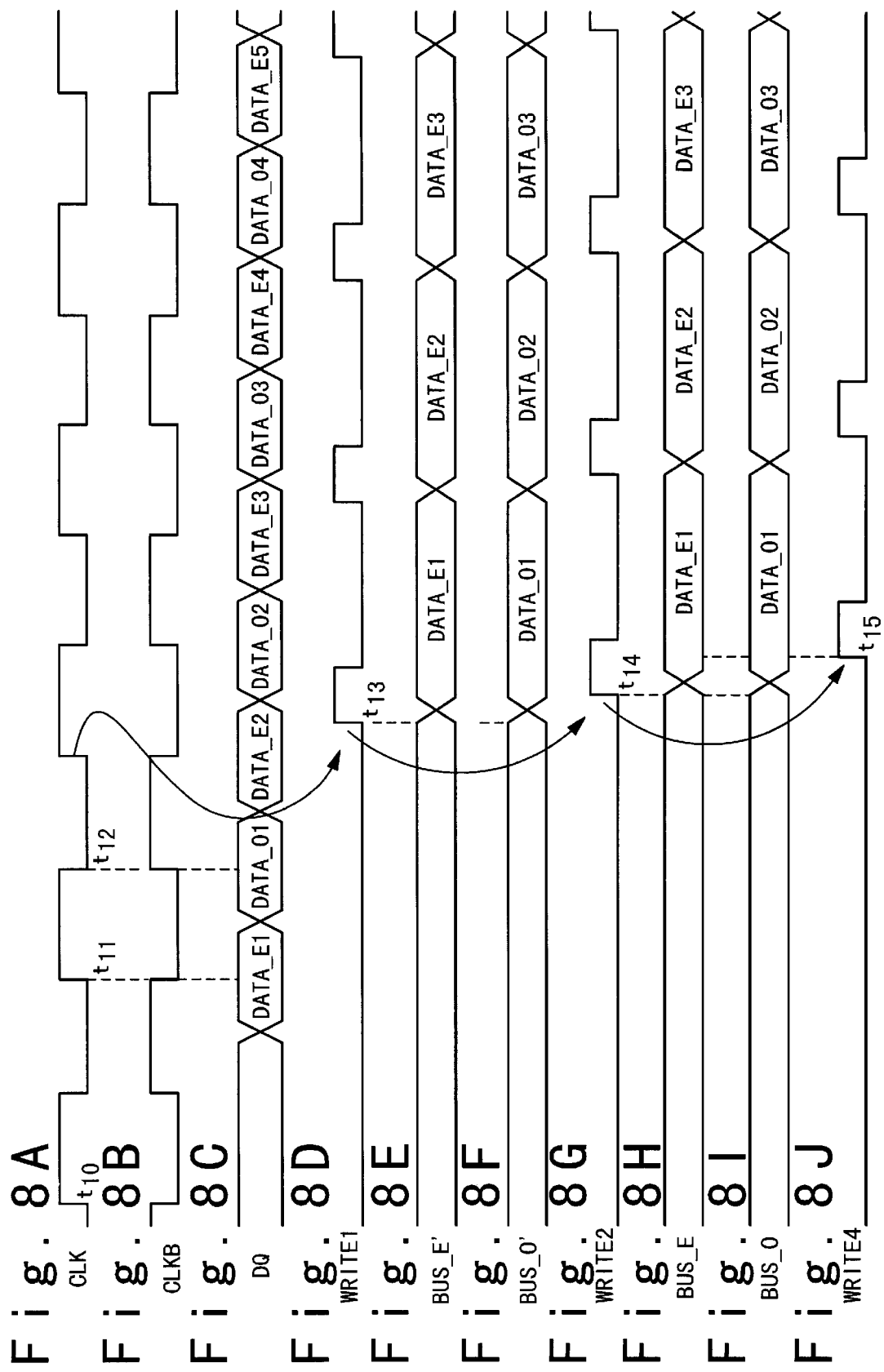
FIGS. 8A to 8J are timing charts showing a write operation of the semiconductor memory in the first embodiment.

When the external clock signal CLK rises up at a time t11, as shown in FIG. 8A, the input control circuit 55 shown in FIG. 6 takes therein the even data Data_E1 from the data input/output pad 13 as the rise write data Write_R and outputs to the R input node 71. The even data Data_E1 is the write data which should be written in the bank #1-E.

Subsequently, when the external clock signal CLK falls down at a time t12, the input control circuit 55 takes therein the odd data Data_O1 from the data input/output pad 13 as the fall write data Write_F and outputs to the F input node 72. The odd data Data_O1 is the write data which should be written in the bank #1-O. At this time, the selector 56 outputs the even data Data_E1 to the E input node 79 as the even write data Write_E, and outputs the odd data Data_O1 to the O input node 80 as the odd write data Write_O, based on the lowest start address signal Y0 of "0".

The tri-state buffer 57 receives the even data Data_E1, and the tri-state buffer 58 receives the odd data Data_O1.

After that, as shown in FIG. 8D, the control circuit 14 raises the control signal Write1 from the low voltage to the high voltage at a time t13. When the control signal Write1 rises up, the tri-state buffer 57 outputs the even data Data_E1 to the second even data bus BUS_E'. In the same way, the tri-state buffer 58 outputs the odd data Data_O1 to the second odd data bus BUS_O', as shown in FIGS. 8E and 8F. The bidirectional buffer circuit 7 receives the even data Data_E1, and the bidirectional buffer circuit 11 receives odd data Data_O1.

Subsequently, the control circuit 14 raises the control signal Write2 from the low voltage to the high voltage at a time t14. When the control signal Write2 rises up, the bidirectional buffer circuit 7 outputs the even data Data_E1 onto the first even data bus BUS_E. In the same way, when the control signal Write2 rises up, the bidirectional buffer circuit 11 outputs the odd data Data_O1 onto the first odd data bus BUS_O.

More subsequently, the control circuit 14 raises the control signal Write4 from the low voltage to the high voltage at a time t15, as shown in FIG. 8J. When the control signal Write4 rises up, the main amplifier 4-1 writes the even data Data_E1 in the bank #1-E. In the same way, when the control signal Write4 rises up, the main amplifier 5-1 writes the odd data Data_O1 in the bank #1-O.

When the following writing instruction continues, the even data Data_E2 and E3 and odd data Data_O2 and O3 are inputted subsequent to the even data Data_E1 and the odd data Data_O1 are written in the bank #2-E–#4-E and any of the bank #2-O–#4-O in the same way.

In the first embodiment, the bidirectional buffer circuit 7 and the bidirectional buffer circuit 11 are provided for the route connecting the banks #1 to #4 and the I/O circuit 9. Also, the lengths of the first even data bus BUS_E, the second even data bus BUS_E', the first odd data bus BUS_O and the second odd data bus BUS_O' are shortened. In this way, it is not necessary to use long buses to transfer data between the banks #1 to #4 and the I/O circuit 9.

The delay time is shortened in the data transfer between the banks #1 to #4 and the I/O circuit 9 by providing the bidirectional buffer circuit 7 and the bidirectional buffer circuit 11 in the route connecting the banks #1 to #4 and the I/O circuit 9. The time required for data to be transferred on the bus is proportional to the square of the length of the bus. In the first embodiment, one of two buses connecting the banks #1 to #4 and the I/O circuit 9 is divided into the first even data bus BUS_E and the second even data bus BUS_E' by the bidirectional buffer circuit 7. The other is divided into the first odd data bus BUS_O and the second odd data bus BUS_O' by the bidirectional buffer 11. For example, the bidirectional buffer circuit 7 can be provided for the halfway point of the bus connecting the main amplifier 4 and the I/O circuit 9 to equally divide into the first even data bus BUS_E and the second even data bus BUS_E'. In this case, the time constant of each of the first even data bus BUS_E and the second even data bus BUS_E' is a quarter, and the delay time of the entire bus becomes about ½. Thus, the shortening of the delay time in case of data transfer between the bank #1 and the I/O circuit 9 is attempted.

In the first embodiment, a case is described where the bidirectional buffer circuit is inserted in each of the two route connecting the banks #1 to #4 and the I/O circuit 9. However, n (n is an integer more than 1) bidirectional buffer circuits may be provided in each bus to divide the bus connecting the banks #1 to #4 and the I/O circuit 9 into (n+1). In this case, the time constant of each portion of the bus becomes smaller and the delay time of the entire bus can be also made smaller. Thus, it is possible to attempt for the memory to speed up.

Moreover, in the first embodiment, the operation timings of the main amplifier 4, the main amplifier 5, the bidirectional buffer circuit 7, the I/O circuit 9 and the bidirectional buffer circuit 11 are controlled by the control circuit 14 to optimize the transfer timing of the data.

Figure 9:
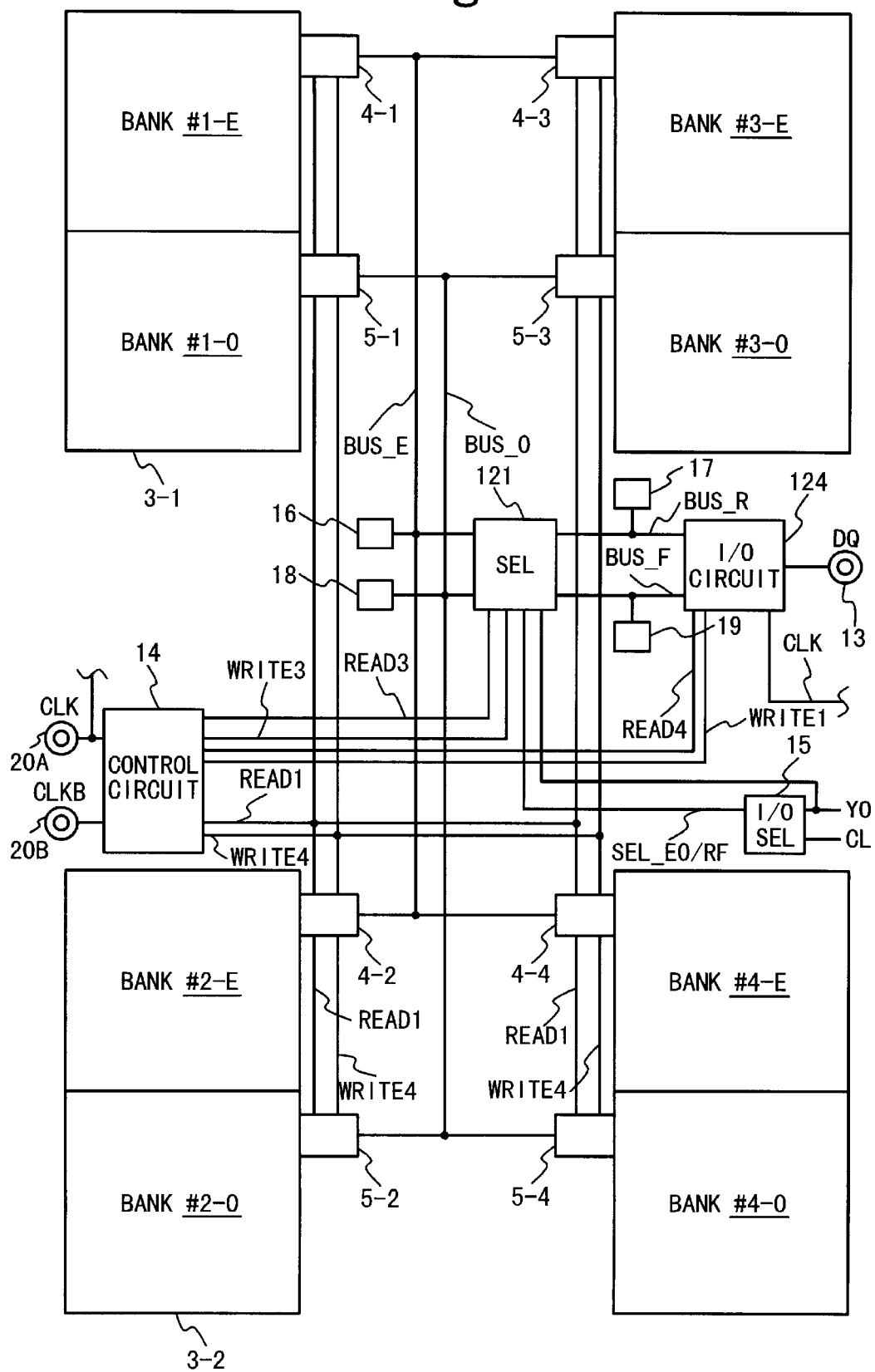
FIG. 9 shows the semiconductor memory according to a second embodiment of the present invention.

FIG. 9 shows the semiconductor memory device according to the second embodiment of the present invention. The semiconductor memory device in the second embodiment is SDRAM like the first embodiment. However, the second embodiment differs from the semiconductor memory device in the first embodiment in the following points.

At first, the relaying unit of the bidirectional buffer circuit 7 and the bidirectional buffer circuit 11 in the first embodiment is substituted by a relaying unit of a selector circuit 121.

At second, the second even data bus BUS_E' and the second odd data bus BUS_O' are substituted by a Rise data bus BUS_R and a Fall data bus BUS_F, respectively. The latch circuit 17 and the latch 19 are connected with the Rise data bus BUS_R and the fall data bus BUS_F, respectively.

At third, the I/O circuit 9 is substituted by the I/O circuit 124.

At fourth, the operation instruction signal SEL_EO/RF outputted from the data output operation instructing circuit 15 is supplied to the selector circuit 121. Also, the control circuit 14 outputs a control signal Read3 to the selector circuit 121 instead of the control signal Read2 and outputs the control signal Read3 to the selector circuit 121 instead of the control signal Write2.

The circuit structure of the other portion of the semiconductor memory device in the second embodiment is same as that of the semiconductor memory device in the first embodiment.

The semiconductor memory device in the second embodiment carries out the same operation as the semiconductor memory device in the first embodiment from an external apparatus connected with the semiconductor memory device. However, the processing which is carried out inside is different between the first embodiment and the second embodiment.

When the read operation is carried out, the selector circuit 121 outputs one of the even read data transferred on the first even data bus BUS_E and the odd read data transferred on the first odd data bus BUS_O to the rise data bus BUS_R and outputs the other to the fall data bus BUS_F. Which of the even read data and the odd read data is outputted to one of the rise data bus BUS_R and the fall data bus BUS_F is specified in accordance with the operation instruction signal SEL_EO/RF. As described above, the operation instruction signal SEL_EO/RF is determined based on the lowest address and the CAS latency of the read start address, as shown in FIG. 3. The data outputted onto the rise data bus BUS_R in case of the read operation is hereinafter referred to as the rise read data, and the data outputted onto the fall data bus BUS_F is hereinafter referred to as the fall read data.

At this time, the I/O circuit 124 outputs the rise read data outputted to the rise data bus BUS_R to the data input/output pad 13 using the rising edge of the flying clock signal Read4 as a trigger. Moreover, the I/O circuit 124 outputs the fall read data outputted to the fall data bus BUS_F using the falling edge of the flying clock signal Read4 to the data input/output pad 13 as a trigger.

On the other hand, when the write operation is carried out, the I/O circuit 124 outputs the data taken-in by using the rising edge of the external clock signal CLK as a trigger to the rise data bus BUS_R and outputs the data taken-in by using the falling edge of the external clock signal CLK as a trigger to the fall data bus BUS_F. The data taken-in by using the rising edge of the external clock signal CLK as the trigger is hereinafter referred to as the rise write data and the data taken-in by using the falling edge as the trigger is referred to as the fall write data.

At this time, the selector circuit 121 outputs one of the rise write data and the fall write data to the first even data bus BUS_E as the even write data in accordance with whether the write start address is an even numbered address or an odd numbered address, and outputs the other hand to the first odd data bus BUS_O as the odd write data.

Subsequently, the circuit structure of the selector circuit 121 and the I/O circuit 124 will be described in detail.

Figure 10:
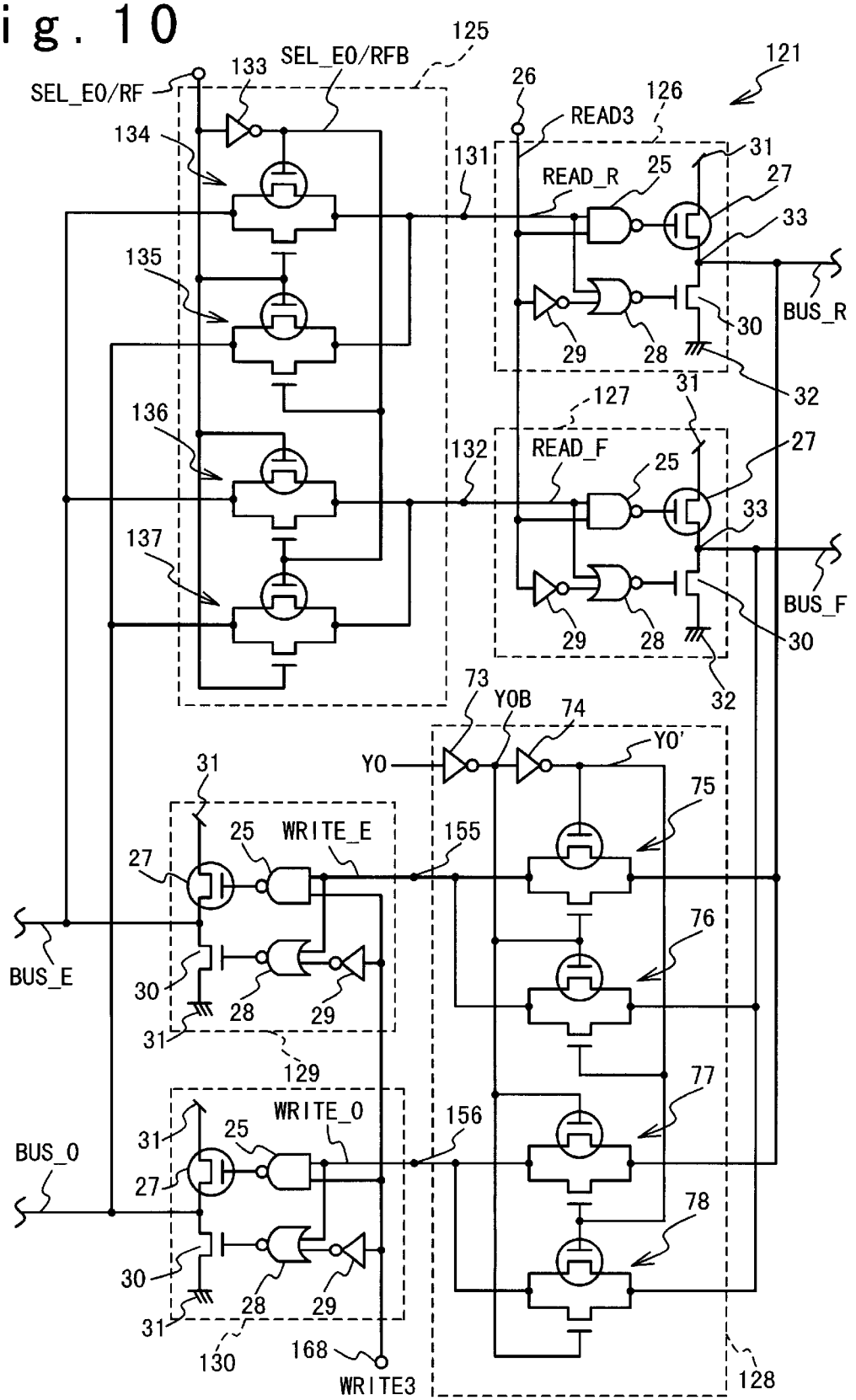
FIG. 10 shows the circuit structure of a selector circuit.

FIG. 10 shows the circuit structure of the selector circuit 121. The selector circuit 121 is comprised of selectors 125 and 128, tri-state buffers 126, 127, 129 and 130.

The selector 125, the tri-state buffer 126, and the tri-state buffer 127 are used in case of the read operation. The selector 125 is comprised of an inverter 133 and transfer gates 134 to 137. The circuit structure of the selector 125 is the same as the selector 51 which is contained in the I/O circuit 9 of the first embodiment. In response to an operation instruction signal SEL_EO/RF, the selector 125 outputs one of the even read data transferred on the first even data bus BUS_E and the odd read data transferred on the first odd data bus BUS_O and to the R output node 131 as the rise read data Read_R and outputs the other to the F output node 132 as the fall read data Read_F.

In more detail, when the operation instruction signal SEL_EO/RF is "0" (=low voltage), the selector 125 outputs the even read data to the R output node 131 as the Rise reading Read_R and outputs the odd read data to the F output node 132 as the fall read data Read_F. On the other hand, when the operation instruction signal SEL_EO/RF is "1" (=high voltage), the selector 125 outputs the even read data to the F output node 132 as the fall read data Read_F and outputs the odd read data to the R output node 131 as the rise read data Read_R.

The tri-state buffer 126 is connected with the R output node 131. The circuit structure of the tri-state buffer 126 is the same as that of the tri-state buffer 23 of the bidirectional buffer 7 of the first embodiment. The tri-state buffer 126 receives the rise read data Read_R from the selector 125 and buffers it. Moreover, when the tri-state buffer 126 is activated based on the control signal Read3, the tri-state buffer 126 outputs the received rise read data Read_R onto the rise data bus BUS_R.

On the other hand, the tri-state buffer 127 is connected with the F output node 132. The circuit structure of the tri-state buffer 127 is the same as that of the tri-state buffer 23 of the bidirectional buffer 7 of the first embodiment. The tri-state buffer 127 receives the fall read data Read_F from the F output node 132 and buffers it. Moreover, when the tri-state buffer 127 is activated based on the control signal Read3, the tri-state buffer 127 outputs the received fall read data Read_F onto the fall data bus BUS_F.

On the other hand, the selector 128, the tri-state buffer 129 and the tri-state buffer 130 are used in case of the write operation. The circuit structure of the selector 128 is the same as that of the selector 56 of the I/O circuit 9 of the first embodiment. The selector 128 receives the rise write data from the rise data bus BUS_R and receives the fall write data from the fall data bus BUS_F. The selector 128 outputs one of the rise write data and the fall write data to the E input node 155 as the even write data Write_E, and outputs the other to the O input node 156 as the odd write data Write_O.

In more detail, when the start address signal Y0 is "0" (=low voltage), i.e., the write start address is an even numbered address, the selector 128 outputs the rise write data to the E input node 155 as the even write data Write_E, and outputs the fall write data to the O input node 156 as odd write data Write_O. On the other hand, when the start address signal Y0 is "1" (=high voltage), i.e., when the write start address is an odd numbered address, the selector 128 outputs the rise write data to the O input node 156 as the odd write data Write_O, and outputs the fall write data to the E input node 155 as the even write data Write_E.

The E input node 155 is connected with the tri-state buffer 129. The circuit structure of the tri-state buffer 129 is the same as that of the tri-state buffer 23 shown in the first embodiment. The tri-state buffer 129 receives the even write data Write E from the selector 128 and buffers it. Moreover, when the tri-state buffer 129 is activated based on the control signal Write3, the tri-state buffer 129 outputs the received even write data Write_E to the first even data bus BUS_E.

On the other hand, the O input node 156 is connected with the tri-state buffer 130. The circuit structure of the tri-state buffer 130 is the same as that of the tri-state buffer 23 shown in the first embodiment. The tri-state buffer 130 receives the odd write data Write_O from the selector 128 and buffers it more. Moreover, the tri-state buffer 130 outputs the received odd write data Write_O to the first odd data bus BUS_O.

Figure 11:
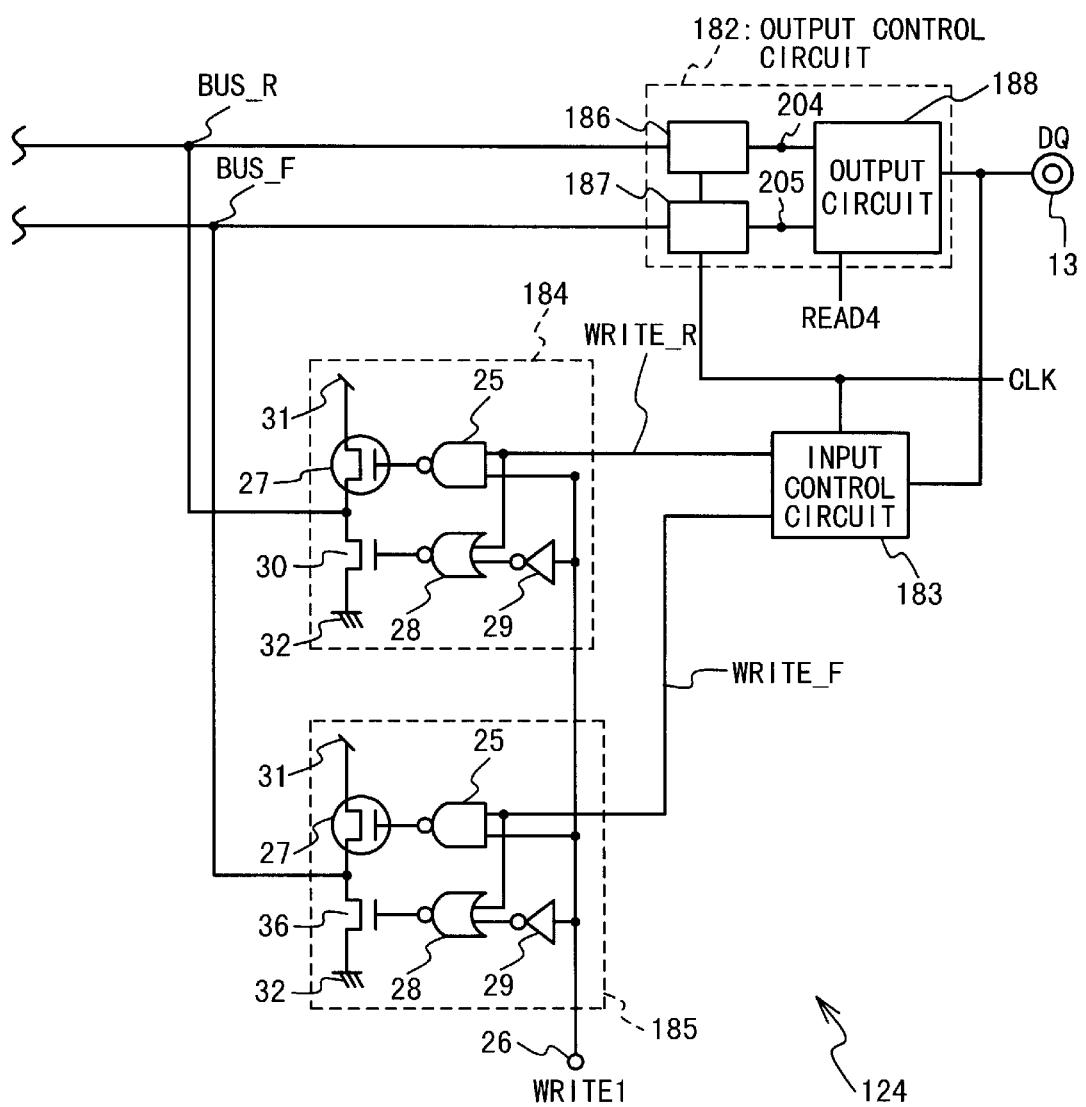
FIG. 11 shows the circuit structure of an I/O circuit.

FIG. 11 shows the circuit structure of the I/O circuit 124. The I/O circuit 124 contains an output control circuit 182, an input control circuit 183, and tri-state buffers 184 and 185.

The output control circuit 182 is used in case of the read operation. The output control circuit 182 is comprised of latches 186, and 187 and an output circuit 188. The external clock signal CLK is inputted to the latch 186. The latch 186 takes therein the rise read data from the rise data bus BUS_R and outputs it to the R output node 204 when the external clock signal CLK falls down. After that, when the flying clock signal Read4 rises up, the rise read data outputted to the R output node 204 is outputted to the data input/output pad 13.

In the same way, when the external clock signal CLK rises up, the latch 187 takes therein the fall read data from the fall data bus BUS_F and outputs to the F output node 205. The fall read data outputted to the F output node 205 is outputted to the data input/output pad 13 when the flying clock signal Read4 is falls down.

The output circuit 188 outputs the rise read data outputted to the R output node 204 to the data input/output pad 13 using the rising edge of the flying clock signal Read4 as a trigger, and outputs the fall read data outputted to the F output node 205 to the data input/output pad 13 using the falling edge of the flying clock signal Read4 as a trigger.

On the other hand, the input control circuit 183, the tri-state buffers 184 and 185 are used in case of the write operation.

The input control circuit 183 takes therein the write data using both of the rising edge and falling edge of the external clock signal CLK as the triggers. As previously mentioned, the data taken in by using the rising edge of the external clock signal CLK as the trigger is referred to as the rise write data, and the data taken in by using the falling edge of the external clock signal CLK as the trigger is referred to as the fall write data. The input control circuit 183 outputs the rise write data Write_R to the tri-state buffer 184 and outputs the fall write data Write_F to the tri-state buffer 185.

The circuit structure of the tri-state buffer 184 is the same as the circuit structure of the tri-state buffer 23 shown in the first embodiment. The tri-state buffer 184 receives the rise write data Write_R from the input control circuit 183 and buffers it. Moreover, when the tri-state buffer 184 is activated based on the control signal Write1, the tri-state buffer 184 outputs the received rise write data Write_R to the rise data bus BUS_R.

The circuit structure of the tri-state buffer 185 is the same as the circuit structure of the tri-state buffer 23 shown in the first embodiment. The tri-state buffer 185 receives the fall write data Write_F from the input control circuit 183 and buffers it. Moreover, when the tri-state buffer 185 is activated based on the control signal Write1, the tri-state buffer 185 outputs the received fall write data Write_F to the fall data bus BUS_F.

Subsequently, the read operation of the semiconductor memory device in the second embodiment will be described. Before the read operation is carried out, the CAS latency is indicated to the semiconductor memory device. Below, the CAS latency is supposed to have been set to 2.0.

As shown in FIG. 12, the read instruction is supposed to have issued to the semiconductor memory device at a time t20 in synchronism with the rising edge of the external clock signal CLK. A read start address is specified by the read instruction. Here, the write start address is an even numbered address, i.e., the lowest start address signal Y0 is supposed to be set to "0". In this case, as shown in FIG. 3, the operation instruction signal _EO/RF is set to "0". Therefore, the I/O circuit 124 outputs even data to the data input/output pad 13 when the flying clock signal Read4 rises up and outputs odd data to the data input/output pad 13 when the flying clock signal Read4 falls down.

The operation when the main amplifier 4 outputs the even data Data_E1 to the first even data bus BUS_E and the operation when the main amplifier 5 outputs the odd data Data_O1 to the first odd data bus BUS_O are same as those of the first embodiment. In response to a read instruction, one main amplifier 4 and one main amplifier 5 are selected in accordance with the read address. Here, the main amplifier 4-1 and the main amplifier 5-1 are supposed to have been selected. The main amplifier 4-1 reads the even data Data_E1 from the bank #1-E. Moreover, the main amplifier 5-1 reads the odd data Data_O1 from the bank #1-O. Subsequently, as shown in FIG. 12, the control circuit 14 raises up the control signal Read1 from the low voltage to the high voltage at the time t21 after a predetermined time from the issuance of the read instruction. The main amplifier 4-1 outputs the even data Data_E1 to the first even data bus BUS_E when the control signal Read1 rises up. In the same way, the main amplifier 5-1 outputs the odd data Data_E1 to the first odd data bus BUS_O when the control signal Read1 rises up.

The selector circuit 121 receives the even data Data_E1 from the first even data bus BUS_E and receives the odd data Data_O1 from the first odd data bus BUS_O. At this time, the selector 125 of the selector circuit 121 shown in FIG. 10 outputs the even data Data_E1 to the R output node 131 as the rise read data Read_R and outputs the odd data Data_O1 to the F output node 132 as the fall read data Read_R, in response to the operation instruction signal SEL_EO/RF of "0".

Subsequently, the control circuit 14 raises up the control signal Read3 from the low voltage to the high voltage at the time t22 after a predetermined time from the time t21, as shown in FIG. 12. The tri-state buffer 126 buffers and outputs the even data Data_E1 to the rise data bus BUS_R. On the other hand, the tri-state buffer 127 buffers and outputs the odd data Data_O1 to the fall data bus BUS_F.

After that, when the external clock signal CLK falls down at a time t23 (t23>t22), the latch 186 of the I/O circuit 124 takes therein the even data Data_E1 from the rise data bus BUS_R and outputs to the R output node 204. After that, when the flying clock signal Read4 rises up at a time t24, the output circuit 188 takes therein the even data Data_E1 from the R output node 204 and outputs to the data input/output pad 13.

As described above, the flying clock signal Read4 is the signal which has the phase proceeding to the external clock signal CLK a little bit. The phase of the flying clock signal Read4 proceeds by a phase equivalent to the delay time in the I/O circuit 124. Thus, the delay time in the I/O circuit 124 is compensated.

Subsequently, when the external clock signal CLK rises up at a time t25, the latch 187 of the I/O circuit 124 takes therein the odd data Data_O1 from the fall data bus BUS_F and outputs to the F output node 205. After that, the output circuit 188 takes therein the odd data Data_O1 from the F output node 205 and outputs to the data input/output pad 13 when the flying clock signal Read4 falls down at a time t26. With the output of the odd data Data_O1, the delay time in the I/O circuit 124 is compensated by giving the flying clock signal Read4 the small proceeding phase, like the case of the even data Data_E1.

In this way, when the CAS latency is 2.0 and the read start address is an even numbered address, the even data Data_E1 is outputted to the data input/output pad 13, by using the rising edge of the flying clock signal Read4 as a trigger, and the odd data Data_O1 is outputted to the data input/output pad 13 by using the falling edge of the flying clock signal Read4 as a trigger.

When the following read instruction continues, even data data_E2 read out from the even bank 1 subsequent to the even data Data_E1 is outputted by the data input/output pad 13 by using the rising edge of the flying clock signal Read4 as a trigger, in the same way. Also, odd data data_O2 read out from odd the bank 2 subsequent to the odd data Data_

O1 is outputted by the data input/output pad 13 by using the falling edge of the flying clock signal Read4 as a trigger.

When the CAS latency is different from the above-mentioned 2.0 and the read start address is an odd numbered address, a read operation is carried out, as described above. At this time, which of the rising edge and the falling edge of the flying clock signal Read4 is used for output of the even data and the odd data to the data input/output pad 13 is determined as shown in FIG. 3.

Subsequently, the write operation of the semiconductor memory device in the second embodiment will be described. A write instruction is supposed to issued to the semiconductor memory device at a time t30 in synchronism with the rising edge of the external clock signal CLK as shown in FIG. 13. Here, a write start address is specified based on the write instruction. The write start address is an even numbered address, i.e., the lowest start address signal Y0 is supposed to be set to "0". In this case, the even write data is inputted from the external in synchronism with the rising edge of the external clock signal CLK, and the odd write data is inputted to the data input/output pad 13 in synchronism with the falling edge of the external clock signal CLK.

When the external clock signal CLK rises up at a time t31, the input control circuit 183 shown in FIG. 11 takes therein the even data Data_E1 from the data input/output pad 13 and outputs to the tri-state buffer 184 as the rise write data Write_R. Subsequently, when the external clock signal CLK falls down at a time t32, the input control circuit 183 takes therein the odd data Data_O1 from the data input/output pad 13 and outputs to the tri-state buffer 185 as the fall write data Write_F. The tri-state buffer 184 receives the even data Data_E1 and the tri-state buffer 185 receives the odd data Data_O1.

After that, as shown in FIG. 13, the control circuit 14 raises the control signal Write1 from the low voltage to the high voltage at a time t33. When the control signal Write1 raises up, the tri-state buffer 184 outputs the even data Data_E1 to the rise data bus BUS_R. In the same way, the tri-state buffer 185 outputs the odd data Data_O1 to the fall data bus BUS_F.

The selector circuit 121 receives the even data Data_E1 and the odd data Data_O1. At this time, the selector 128 shown in FIG. 10 outputs the even data Data_E1 received from the rise data bus BUS_R to the tri-state buffer 129 in response to the lowest start address signal Y0 of "0". Moreover, the selector 128 outputs the odd data Data_O1 received from the fall data bus BUS_F to the tri-state buffer 130.

Subsequently, as shown in FIG. 13, the control circuit 14 raises the control signal Write3 from the low voltage to the high voltage at a time t34. When the control signal Write3 rises up, the tri-state buffer 129 outputs the even data Data_E1 to the first even data bus BUS_E. When the control signal Write3 rises up, the tri-state buffer 130 outputs the odd data Data_O1 to the first odd data bus BUS_O, in the same way.

Subsequently, the control circuit 14 raises the control signal Write4 from the low voltage to the high voltage at a time t35. When the control signal Write4 rises up, the main amplifier 4-1 writes the even data Data_E1 in the bank #1-E. In the same way, when the control signal Write4 rises up the main amplifier 5-1 writes the odd data Data_O1 in the bank #1-O.

When the following writing instruction continues, the even data data_E2 and E3 inputted subsequently to the even data Data_E1 and odd data data_O2 and O3 inputted subsequently to the odd data Data_O1 are written in the bank #2-E and the bank #3-E, and the bank #2-O and the bank #3-O in the same way.

In the same way as the first embodiment, in the second embodiment, the selector circuit 121 is provided between the route connecting the bank 3 and the I/O circuit 124. The length of the first even data bus BUS_E, the first odd data bus BUS_O, the rise data bus BUS_R and the fall data bus BUS_F are shortened. As the bus to transfer data between the banks #1 to #4 and the I/O circuit 124, a long bus is not used. Thus, a memory with the fast data transfer rate in the semiconductor memory device is realized.

Also, in the second embodiment, the operation timings of the main amplifier 4, the main amplifier 5, the selector circuit 121, the I/O circuit 124 are controlled by the control circuit 14 like the first embodiment, and the data transfer timings are optimized.

At this time, in the second embodiment, the number of the buffers relating to the read operation is reduced less than in the first embodiment. That is, as shown in FIG. 6, in the first embodiment, the buffer 52 and the buffer 53 are connected with the output of the selector 51. As described above, this prevents the voltage down of the signal outputted from the selector 51 due to the transfer gates 60 to 63 of the selector 51.

However, in the second embodiment, the tri-state buffer 126 and the tri-state buffer 127 play the role to compensate the voltage drops due to the selectors 125 and 128. That is, the tri-state buffer 126 and the tri-state buffer 127 play the roles of the tri-state buffers 23 and 24 and the buffers 52 and the buffer 53 in the first embodiment. Thus, the number of the buffers relating to the read operation is reduced. At this point, the second embodiment is more desirable than the first embodiment.

According to the semiconductor memory device of the present invention, the delay time in the data transfer between the memory cell and the input/output pad can be made small.

Also, according to the semiconductor memory device of the present invention, the number of buffers relating to data transfer between the memory cell and the input/output pad can be reduced.

What is claimed is:

1. A semiconductor memory device comprising:
   a memory cell array which has an even bank activated based on even numbered addresses and an odd bank activated based on odd numbered addresses;
   a first even data bus connected with said even bank, wherein even read data is outputted from said even bank in response to a first control signal;
   a second even data bus;
   a first odd data bus connected with said odd bank, wherein odd read data is outputted from said odd bank in response to said first read control signal;
   a second odd data bus;
   a common data bus;
   a relaying unit provided between a set of said first even and odd data buses and a set of said second even and odd data buses to receive said even read data on said first even data bus to output said even read data to said second even data bus in response to a second read control signal, and to receive said odd read data on said first odd data bus to output said odd read data to said second odd data bus in response to said second read control signal; and
   an I/O circuit provided between said common data bus and the set of said second even and odd data buses to receive said even read data from said second even data bus and said odd read data from said second odd data bus, and to output one of said even read data and said odd read data to said common data bus and then outputs the other to said common data bus, in response to a third read control signal.

2. The semiconductor memory device according to claim 1, further comprising:
   an external connection pad connected with said common data bus.

3. The semiconductor memory device according to claim 1, wherein said I/O circuit selects one of said even read data and said odd read data based on a read selection control signal and outputs the selected data to said common data bus and then the other to said common data bus in response to said third read control signal.

4. The semiconductor memory device according to claim 3, wherein said I/O circuit outputs the selected data to said common data bus in response to a rising edge of said third read control signal and then the other to said common data bus in response to a falling edge of said third read control signal.

5. The semiconductor memory device according to claim 3, wherein said I/O circuit receives write data from said common data bus in response to a first write control signal, said write data containing first write data and second write data subsequent to said first write data, and outputs one of said first and second write data as even write data to said second even data bus and the other as odd write data to said second odd data bus,
   said relaying unit receives said even write data on said second even data bus to output to said first even data bus in response to a second write control signal, and receives said odd write data on said second odd data bus to output to said first odd data bus in response to said second write control signal,
   said even write data is written in said even bank in response to a third write control signal, and said odd write data is written in said odd bank in response to said third write control signal.

6. The semiconductor memory device according to claim 5, wherein said I/O circuit receives said first write data in response to a rising edge of said first write control signal, and said second write data in response to a falling edge of said first write control signal.

7. The semiconductor memory device according to claim 1, wherein said I/O circuit selects one of said first and second write data as said even write data based on a write selection control signal, and outputs said even write data to said second even data bus and the other as said odd write data to said second odd data bus.

8. The semiconductor memory device according to claim 3, further comprising:
   a control circuit which generates said first to third read control signals in response to an external clock signal.

9. The semiconductor memory device according to claim 5, further comprising:
   a control circuit which generates said first to third write control signals in response to an external clock signal.

10. The semiconductor memory device according to claim 3, further comprising:
    a selection control circuit which generates said read selection control signal in response to a read start address and a CAS latency.

11. The semiconductor memory device according to claim 5, further comprising:
    a selection control circuit which generates said write selection control signal in response to a write start address.

12. The semiconductor memory device according to claim 3, wherein said I/O circuit comprises:
    a selector section which selects one of said even read data and said odd read data based on said read selection control signal; and
    an output circuit which outputs the selected data to said common data bus and then the other to said common data bus in response to said third read control signal.

13. The semiconductor memory device according to claim 3, wherein said relaying unit comprises:
    a first tri-state buffer provided between said first even data bus and said second even data bus to receive said even read data on said first even data bus to output said even read data to said second even data bus in response to said second read control signal; and
    a second tri-state buffer provided between said first odd data bus and said second odd data bus to receive said odd read data on said first odd data bus to output said odd read data to said second odd data bus in response to said second read control signal.

14. The semiconductor memory device according to claim 5, wherein said relaying unit comprises:
    a first tri-state buffer provided between said first even data bus and said second even data bus to buffer said even write data on said second even data bus to output said even write data to said first even data bus in response to said second write control signal; and
    a second tri-state buffer provided between said first odd data bus and said second odd data bus to buffer said odd write data on said second odd data bus to output said odd write data to said first odd data bus in response to said second write control signal.

15. A semiconductor memory device comprising:
    a memory cell array which has an even bank activated based on even numbered addresses and an odd bank activated based on odd numbered addresses;
    a first even data bus connected with said even bank, wherein first read data is outputted from said even bank in response to a first control signal;
    a second even data bus;
    a first odd data bus connected with said odd bank, wherein second read data is outputted from said odd bank in response to said first read control signal;
    a second odd data bus;
    a common data bus;
    a relaying unit provided between a set of said first even and odd data buses and a set of said second even and odd data buses to receive said first read data from said even data bus and said second read data from said second odd data bus, and to output one of said first read data and said second read data as third read data to said second even data bus and outputs the other as fourth read data to said second odd data bus, in response to a second read control signal; and
    an I/O circuit provided between said common data bus and the set of said second even and odd data buses to receive said third read data and said fourth read data from the set of said second even and odd data buses and to output said third read data and said fourth read data to said common data bus in response to a third read control signal.

16. The semiconductor memory device according to claim 15, further comprising:
    an external connection pad connected with said common data bus.

17. The semiconductor memory device according to claim 15, wherein said relaying unit selects one of said even read data and said odd read data as said third read data based on a read selection control signal and outputs said third read data to said second even data bus and said fourth read data to said second odd data bus in response to said second read control signal.

18. The semiconductor memory device according to claim 17, wherein said I/O circuit outputs said third read data to said second even data bus in response to a rising edge of said third read control signal and then said fourth read data to said second odd data bus in response to a falling edge of said third read control signal.

19. The semiconductor memory device according to claim 17, wherein said I/O circuit receives write data from said common data bus, said write data containing first write data and second write data subsequent to said first write data, and outputs said first and second write data to said second even data bus and said second odd data bus in response to a first write control signal, said relaying unit selects one of said first write data and said second write data to output the selected one of said first write data and said second write data as third write data to said first even data bus, and outputs the other as fourth write data to said first even and odd data buses in response to said second write control signal, said third write data on said first even data bus is written in said even bank in response to a third write control signal, and said fourth write data on said first odd data bus is written in said odd bank in response to said third write control signal.

20. The semiconductor memory device according to claim 19, wherein said I/O circuit outputs said first write data onto said second even data bus in response to a rising edge of said first write control signal, and said second write data onto said second odd data bus in response to a falling edge of said first write control signal.

21. The semiconductor memory device according to claim 20, wherein said relaying unit selects one of said first and second write data as said third write data based on a write selection control signal.

22. The semiconductor memory device according to claim 17, further comprising:

a control circuit which generates said first to third read control signals in response to an external clock signal.

23. The semiconductor memory device according to claim 19, further comprising:

a control circuit which generates said first to third write control signals in response to an external clock signal.

24. The semiconductor memory device according to claim 17, further comprising:

a selection control circuit which generates said read selection control signal in response to a read start address and a CAS latency.

25. The semiconductor memory device according to claim 19, further comprising:

a selection control circuit which generates said write selection control signal in response to a write start address.

26. The semiconductor memory device according to claim 19, wherein said I/O circuit comprises:

an output circuit which outputs said third read data on said second even data bus and said fourth read data on said second odd data bus to said common data bus in response to said third read control signal.

27. The semiconductor memory device according to claim 17, wherein said relaying unit comprises:

a selector section connected with said first even and odd data buses to select one of said first read data and said second read data as said third read data based on said read selection control signal, the other is said fourth read data;

a first tri-state buffer connected with said second even data bus to buffer and output said third read data onto said second even data bus in response to said third read control signal; and a second tri-state buffer connected with said second odd data bus to buffer and output said fourth read data onto said second odd data bus in response to said second read control signal.

28. The semiconductor memory device according to claim 19, wherein said relaying unit comprises:

a selector section connected with said second even and odd data buses to select one of said first write data and said odd read data based on said read selection control signal, the other being said fourth write data;

a first tri-state buffer connected with said first even data bus to buffer and output said third read data onto said first even data bus in response to said third read control signal; and a second tri-state buffer connected with said first odd data bus to buffer and output said fourth write data onto said first odd data bus in response to said second read control signal.

* * * * *